US006750696B2

(12) United States Patent
Shimada et al.

(10) Patent No.: US 6,750,696 B2
(45) Date of Patent: Jun. 15, 2004

(54) LEVEL CONVERSION CIRCUIT CONVERTING LOGIC LEVEL OF SIGNAL

(75) Inventors: Takahiro Shimada, Hyogo (JP); Hiromi Notani, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/426,653

(22) Filed: May 1, 2003

(65) Prior Publication Data

US 2003/0227316 A1 Dec. 11, 2003

(30) Foreign Application Priority Data

Jun. 10, 2002 (JP) ....................................... 2002-168340
Jan. 28, 2003 (JP) ....................................... 2003-018373

(51) Int. Cl.[7] .............................. H03L 5/00; G05F 1/10

(52) U.S. Cl. ......................... 327/333; 327/537; 326/68; 326/81

(58) Field of Search ................................ 327/333, 306, 327/534, 535, 537; 326/62, 63, 80, 81, 68

(56) References Cited

U.S. PATENT DOCUMENTS 5,963,055 A * 10/1999 Tanaka et al. ................ 326/81
6,104,214 A * 8/2000 Ueda et al. ................. 326/115
6,218,892 B1 * 4/2001 Soumyanath et al. ....... 327/537
6,535,046 B2 * 3/2003 Kaiser et al. ............... 327/333

FOREIGN PATENT DOCUMENTS

JP 2001-36388 2/2001

OTHER PUBLICATIONS

Tomishima, et al. "A 1.0V 230MHz Column–Access Embedded DRAM Macro for Portable MPEG Applications" 2001 IEEE International Solid–State Circuits Conference (Feb. 7, 2001).

* cited by examiner

*Primary Examiner*—Tuan T. Lam
(74) *Attorney, Agent, or Firm*—McDermott, Will & Emery

(57) ABSTRACT

A bias potential generation circuit in a level conversion circuit sets a bias potential applied to the backgate of an N-channel MOS transistor for pull-down at a positive potential when an input signal is set at the "L" level and the first and second signals are set at the "H" and "L" levels respectively, to lower the threshold voltage of the N-channel MOS transistor. Therefore, even if an amplitude voltage of the input signal is lowered, the operating speed can be increased.

20 Claims, 17 Drawing Sheets

LEVEL CONVERSION CIRCUIT CONVERTING LOGIC LEVEL OF SIGNAL

BACKGROUND OF THE INVENTION

1. Field of the Invention

The present invention relates to a level conversion circuit, and more particularly, to a level conversion circuit converting a first signal having one level at a reference potential and the other level at a first potential higher than the reference potential into a second signal having one level at the reference potential and the other level at a second potential higher than the first potential, to output the converted signal to an output node.

2. Description of the Background Art

Conventionally, a semiconductor integrated circuit device is provided with a level conversion circuit converting a signal VI having an amplitude voltage of a first power-supply voltage VDD into a signal VO having an amplitude voltage of a second power-supply voltage VDDH higher than first power-supply voltage VDD. In recent years, however, power-supply voltages VDD and VDDH have been lowered in order to reduce power consumption in a semiconductor integrated circuit device, which has caused a problem that the current drivability of an MOS transistor is deteriorated as first power-supply voltage VDD is lowered, reducing the operating speed of the level conversion circuit.

One method for increasing the operating speed of the level conversion circuit is to directly connect the gate and the backgate of the MOS transistor to lower a threshold voltage of the MOS transistor according to a change in level of an input signal (see Japanese Patent Laying-Open No. 2001-36388 for example).

According to this method, however, the gate and the backgate of the MOS transistor are driven by the input signal, resulting in an increase in load capacitance of the input signal, and thus a satisfactorily high operating speed cannot be achieved.

SUMMARY OF THE INVENTION

A primary object of the present invention is, therefore, to provide a level conversion circuit with a high operating speed.

According to one aspect of the present invention, a level conversion circuit converts a first signal having one level at a reference potential and the other level at a first potential higher than the reference potential into a second signal having one level at the reference potential and the other level at a second potential higher than the first potential, to output the converted signal to an output node. The level conversion circuit includes a load circuit connected between a line of the second potential and the output node; a first N-type transistor having a drain connected to the output node, a source connected to a line of the reference potential, and a gate receiving the first signal; and a bias potential generation circuit having at least one transistor rendered conductive/non-conductive in response to the first signal and generating a bias potential higher than the reference potential and at most the first potential, to apply the bias potential to a backgate of the first N-type transistor, in response to the first signal being set at the first potential. Thus, the threshold voltage of the first N-type transistor can be lowered in response to the first signal being at the first potential, increasing the operating speed.

According to another aspect of the present invention, a level conversion circuit includes a load circuit connected between a line of the second potential and the output node; an N-type transistor having a drain connected to the output node, a source connected to a line of the reference potential and a gate receiving the first signal; and a switching circuit receiving the reference potential and a bias potential that is higher than the reference potential and equal to or lower than a built-in potential of a PN junction between a backgate and a source of the N-type transistor, applying the bias potential to the backgate of the N-type transistor in response to the first signal being set at the first potential, and applying the reference potential to the backgate of the N-type transistor in response to the first signal being set at the reference potential. Thus, the threshold voltage of the N-type transistor can be lowered in response to the first signal being at the first potential, increasing the operating speed.

According to a further aspect of the present invention, a level conversion circuit includes a load circuit connected between a line of the second potential and the output node; and an N-type transistor having a drain connected to the output node, a source connected to a line of the reference potential, a gate receiving the first signal, and a backgate receiving a bias potential equal to or lower than a built-in potential of a PN junction between the backgate and the source. Thus, the threshold voltage of the N-type transistor can be lowered, increasing the operating speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
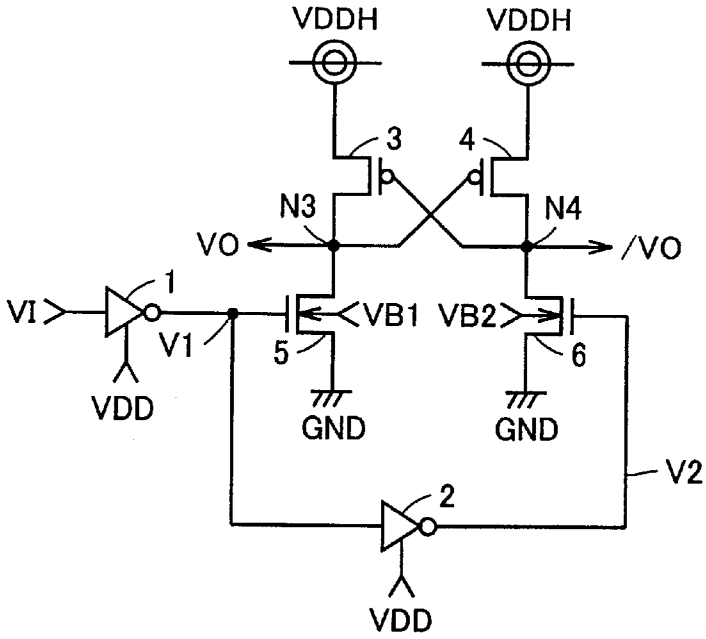
FIG. 1 is a circuit diagram showing a substantial part of a level conversion circuit according to the first embodiment of the present invention.

Referring to FIG. 1, the level conversion circuit is a cross-coupled PMOS level conversion circuit, including inverters 1, 2, P-channel MOS transistors 3, 4, and N-channel MOS transistors 5, 6. The level conversion circuit is to convert a signal VI having an amplitude voltage of a first power-supply voltage VDD into a signal VO having an amplitude voltage of a second power-supply voltage VDDH that is higher than first power-supply voltage VDD.

P-channel MOS transistors 3 and 4 are connected between the lines of second power-supply potential VDDH and output nodes N3, N4, respectively, the gates thereof being connected, respectively, to nodes N4 and N3. An output signal VO appears at node N3, whereas an inversion signal /VO of signal VO appears at node N4. N-channel MOS transistors 5 and 6 are connected between nodes N3, N4 and the lines of a ground potential GND, respectively, the gates thereof receiving signals V1 and V2 respectively, the backgates thereof receiving bias potentials VB1 and VB2 respectively. Inverter 1 is driven by first power-supply voltage VDD, and inverts signal VI to generate signal V1. Inverter 2 is driven by first power-supply voltage VDD, and inverts signal V1 to generate signal V2.

Each of MOS transistors 3 to 6 has a relatively thick gate oxide film, and is formed by a thick film transistor having a high withstand voltage. The thick film transistor has a relatively high threshold voltage VTHH. Each of inverters 1 and 2 has a relatively thin gate oxide film, and is formed by a thin film transistor having a low withstand voltage. The thin film transistor has a relatively low threshold voltage VTHL. Each of inverters 1 and 2 is well known, including a P-channel MOS transistor and an N-channel MOS transistor connected in series between the line of first power-supply potential VDD and the line of ground potential GND.

Figure 2:
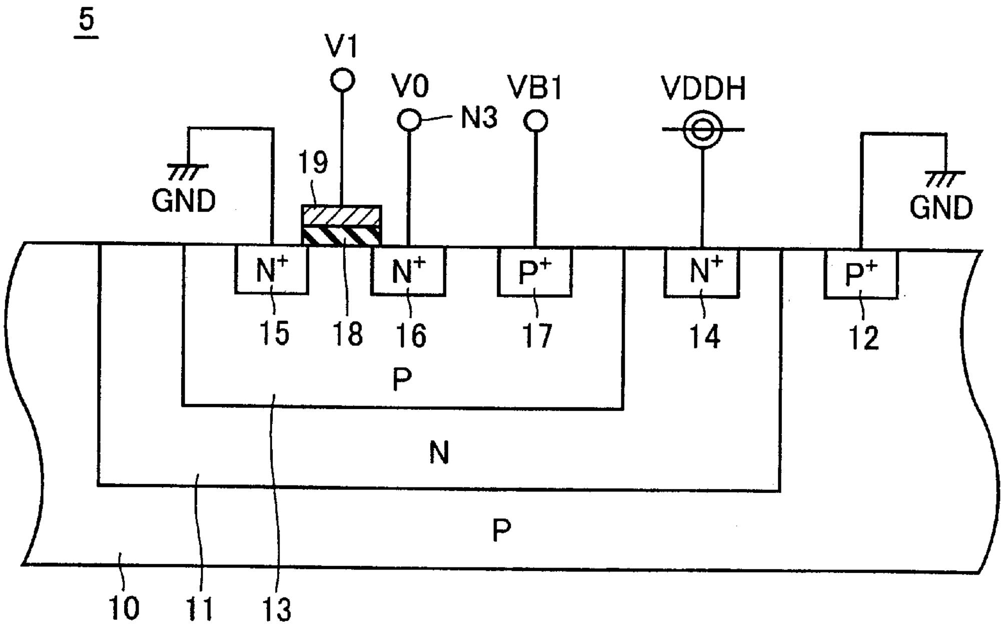
FIG. 2 is a section view showing the configuration of an N-channel MOS transistor shown in FIG. 1.

FIG. 2 is a section view showing the configuration of N-channel MOS transistor 5. In FIG. 2, an N-type well 11 and a $P^+$-type diffusion layer 12 are formed at the surface of a P-type semiconductor substrate 10. A P-type well (backgate) 13 and $N^+$-type diffusion layer 14 are formed at the surface of N-type well 11. An $N^+$-type diffusion layer (source) 15, an $N^+$-type diffusion layer (drain) 16 and a $P^+$-type diffusion layer 17 are formed at the surface of P-type well 13. A gate oxide film 18 and a gate electrode (gate) 19 are formed on the surface of P-type well 13 between $N^+$-type diffusion layers 15 and 16.

$N^+$-type diffusion layer 15 receives ground potential GND. Gate electrode 19 receives output signal V1 of inverter 1. $N^+$-type diffusion layer 16 is connected to output node N3. P-type well 13 receives a bias potential VB1 through $P^+$-diffusion layer 17. Bias potential VB1 is set to a potential equal to or lower than a built-in potential between P-type well 13 and $N^+$-type diffusion layer 15. Hence, conduction would never be provided between P-type well 13 and $N^+$-type diffusion layer 15. Moreover, N-type well 11 receives second power-supply potential VDDH through $N^+$-type diffusion layer 14, whereas P-type semiconductor substrate 10 receives ground potential GND through $P^+$-type diffusion layer 12. Accordingly, the PN junction between P-type semiconductor substrate 10 and N-type well 11 as well as the PN junction between N-type well 11 and P-type well 13 are both maintained in reverse bias condition.

Figure 3:
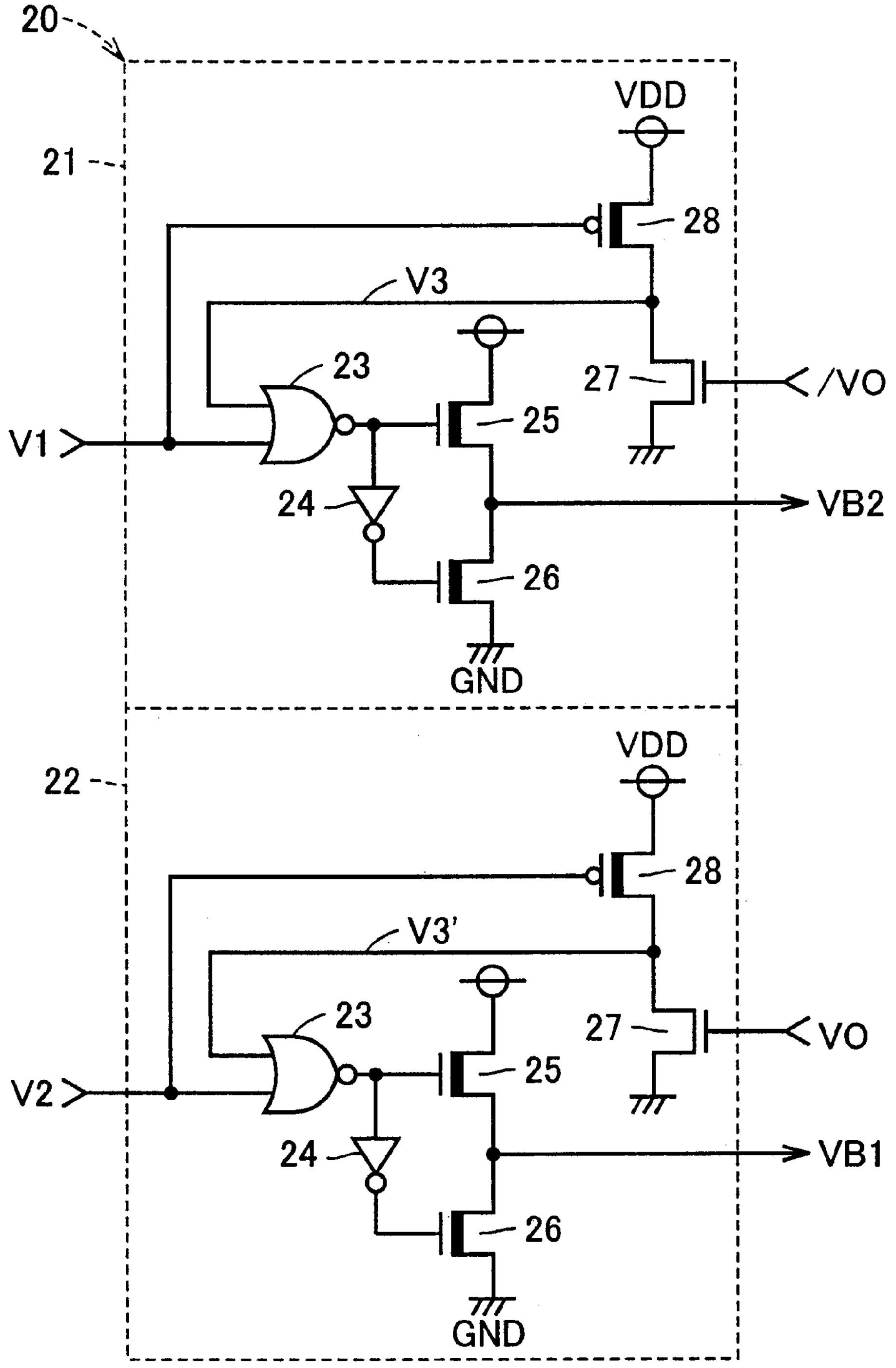
FIG. 3 is a circuit diagram showing the configuration of a bias potential generation circuit generating a bias potential shown in FIG. 1.

FIG. 3 is a circuit diagram showing the configuration of a bias potential generation circuit 20 generating bias potentials VB1, VB2. In FIG. 3, bias potential generation circuit 20 includes a VB2 generation circuit 21 and a VB1 generation circuit 22. VB2 generation circuit 21 includes an NOR gate 23, an inverter 24, N-channel MOS transistors 25 to 27, and a P-channel MOS transistor 28. N-channel MOS transistors 25 and 26 are connected in series between the line of first power-supply potential VDD and the line of ground potential GND. P-channel MOS transistor 28 and N-channel MOS transistor 27 are connected in series between the line of first power-supply potential VDD and the line of ground potential GND, the gates thereof receiving signals V1 and /VO, respectively. An NOR gate 23 receives a signal V1 and a signal V3 that appears at a node between MOS transistors 28 and 27, an output signal thereof being input into the gate of N-channel MOS transistor 25, and also into the gate of N-channel MOS transistor 26 through inverter 24. The potential at the node between N-channel MOS transistors 25 and 26 is a bias potential VB2.

Each of N-channel MOS transistors 25, 26 and P-channel MOS transistor 28 is a thin film transistor, whereas N-channel MOS transistor 27 is a thick film transistor. Each of NOR gate 23 and inverter 24 is formed by a plurality of thin film transistors. While VB1 generation circuit 22 has the same configuration as that of VB2 generation circuit 21, it receives signals V2, VO instead of signals V1, /VO, and produces an output of bias potential VB1 instead of bias potential VB2.

Figure 4:
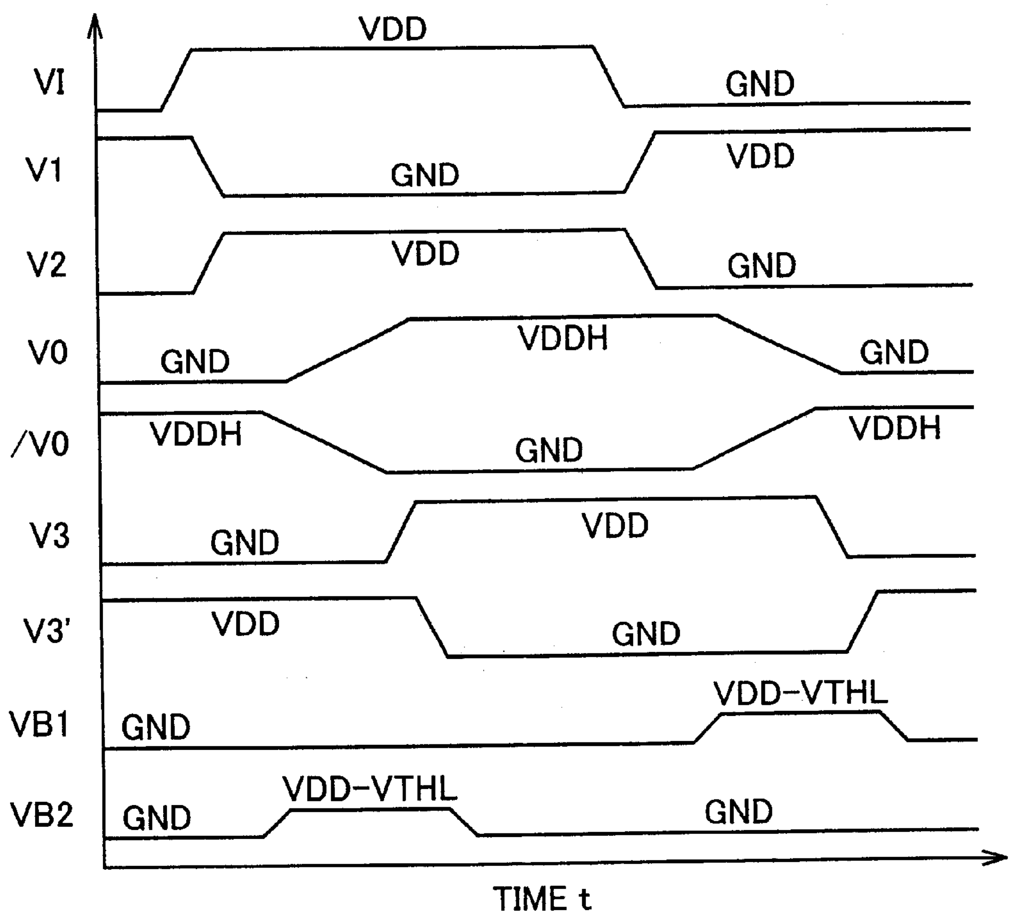
FIG. 4 is a time chart showing an operation of the level conversion circuit shown in each of FIGS. 1 to 3.

FIG. 4 is a time chart illustrating the operation of the level conversion circuit shown in FIGS. 1 to 3. In an initial state, input signal VI is set at the "L" level (GND), while signals V1, V2 are set at the "H" level (VDD) and the "L" level (GND) respectively. Moreover, MOS transistors 4, 5 are rendered conductive while MOS transistors 3, 6 are rendered non-conductive. Signals VO, /VO then have the "L" level (GND) and the "H" level (VDDH) respectively. In addition, signals V3, V3' are set to the "L" level (GND) and the "H" level (VDD) respectively, while bias potentials VB1 and VB2 both have ground potential GND.

When input signal VI is raised from the "L" level (GND) to the "H" level (VDD) at a certain time, signals V1, V2 have the "L" level (GND) and the "H" level (VDD) respectively. When signal V1 is set at the "L" level, N-channel MOS transistor 5 is rendered non-conductive. Moreover, an output signal of NOR gate 23 in VB2 generation circuit 21 is raised to the "H" level (VDD), rendering N-channel MOS transistor 25 conductive while rendering N-channel MOS transistor 26 non-conductive, which raises bias potential VB2 to VDD-VTHL. VDD-VTHL is set at a value equal to or lower than the built-in potential between P-type well 13 and $N^{+}$-type diffusion layer 15 in FIG. 2. When bias potential VB2 is set at VDD-VTHL, threshold voltage VTHH of N-channel MOS transistor 6 is lowered, rendering N-channel MOS transistor 6 conductive. This gradually lowers the level of signal /VO. When the level of signal /VO is lowered, current flowing in P-channel MOS transistor 3 increases, raising the level of signal VO. When the level of signal VO is raised, current flowing in P-channel MOS transistor 4 decreases, further lowering the level of signal /VO. Thus, signals VO, /VO are set at the "H" level (VDDH) and the "L" level (GND) respectively.

When signals VO, /VO are set at the "H" level (VDDH) and the "L" level (GND) respectively, signals V3, V3' have the "H" level (VDD) and the "L" level (GND) respectively. The output signal of NOR gate 23 in VB2 generation circuit 21 then has the "L" level, rendering N-channel MOS transistor 25 non-conductive while rendering N-channel MOS transistor 26 conductive. This makes bias potential VB2 have ground potential GND. When bias potential VB2 is set at ground potential GND, threshold voltage VTHH of N-channel MOS transistor 6 increases, thereby reducing leak current in N-channel MOS transistor 6.

Next, when input signal VI is lowered from the "H" level (VDD) to the "L" level (GND), signals V1, V2 have the "H" level (VDD) and the "L" level (GND) respectively. When signal V2 is set at the "L" level, N-channel MOS transistor 6 is rendered non-conductive. In addition, the output signal of NOR gate 23 in VB1 generation circuit 22 is raised to the "H" level (VDD), rendering N-channel MOS transistor 25 conductive while rendering N-channel MOS transistor 26 non-conductive, which raises bias potential VB1 to VDD-VTHL. When bias potential VB1 is raised to VDD-VTHL, threshold voltage VTHH of N-channel MOS transistor 5 is lowered, rendering N-channel MOS transistor 5 conductive. This gradually lowers the level of signal VO. When the level of signal VO is lowered, current flowing in P-channel MOS transistor 4 increases, raising the level of signal /VO. When the level of signal /VO is raised, current flowing in P-channel MOS transistor 3 decreases, further lowering the level of signal VO. Thus, signals VO, /VO have the "L" level (GND) and the "H" level (VDDH) respectively.

When signals VO, /VO are set at the "L" level (GND) and the "H" level (VDDH) respectively, signals V3, V3' have the "L" level (GND) and the "H" level (VDD) respectively. The output signal of NOR gate 23 in VB1 generation circuit 22 then has the "L" level, rendering N-channel MOS transistor 25 non-conductive while rendering N-channel MOS transistor 26 conductive, which makes bias potential VB1 have ground potential GND. When bias potential VB1 is set at ground potential GND, threshold voltage VTHH of N-channel MOS transistor 5 increases, thereby reducing leak current in N-channel MOS transistor 5.

In the first embodiment, potential VB1 or VB2 of the backgate of N-channel MOS transistor 5 or 6 is increased to lower threshold voltage VTHH of N-channel MOS transistor 5 or 6, in response to input signal V1 or V2 being set at the "H" level, so that a high operating speed can be obtained even if input signals V1, V2 have a low amplitude voltage VDD.

Further, after N-channel MOS transistor 5 or 6 is rendered conductive, potential VB1 or VB2 of the backgate of N-channel MOS transistor 5 or 6 is lowered to raise threshold voltage VTHH of N-channel MOS transistor 5 or 6, so that the leak current in N-channel MOS transistors 5, 6 can be reduced.

Figure 5:
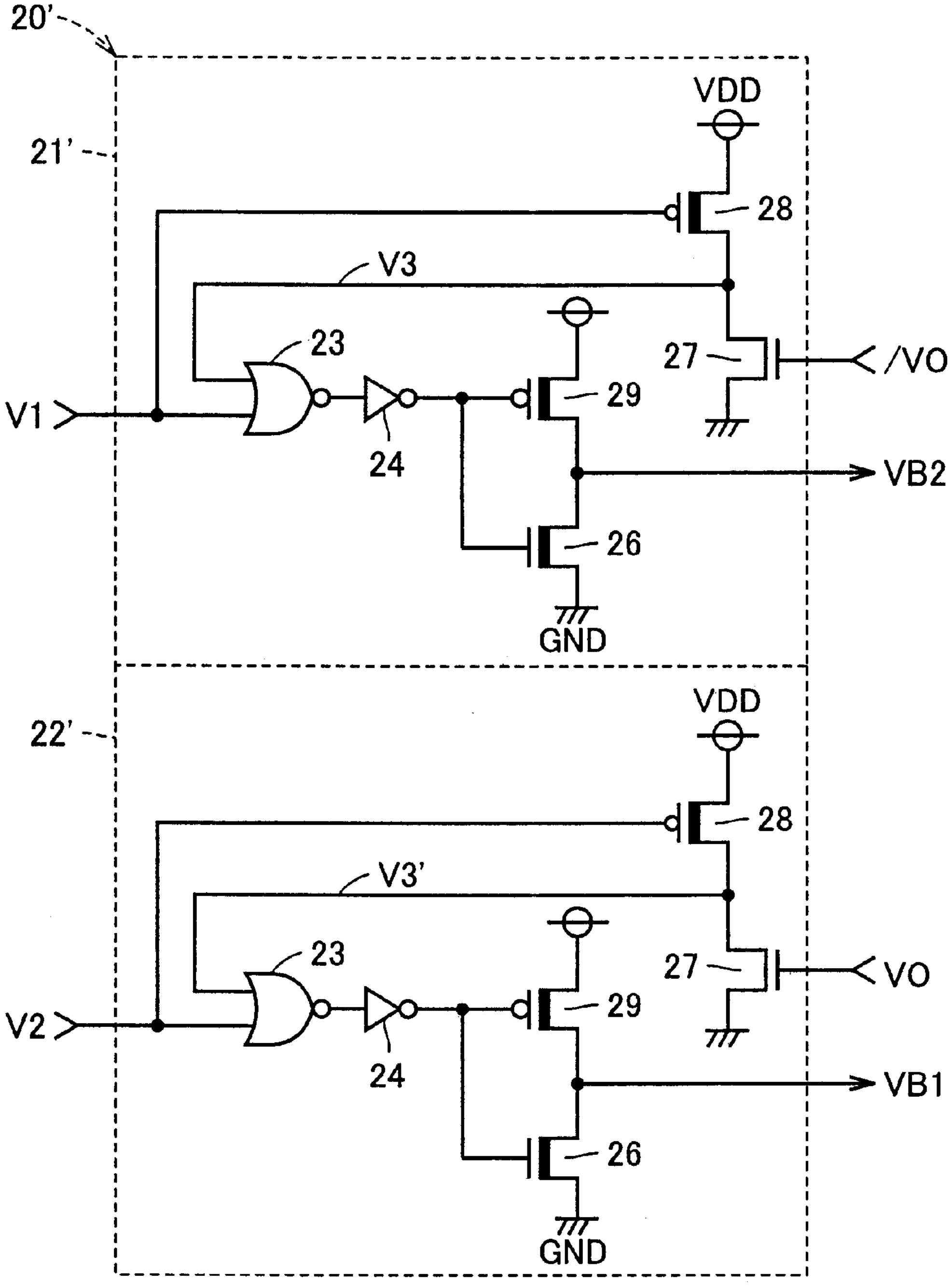
FIG. 5 is a circuit diagram showing a modification of the first embodiment.

It is noted that, as shown in FIG. 5, in each of VB2 generation circuit 21 and VB1 generation circuit 22, N-channel MOS transistor 25 may be replaced by P-channel MOS transistor 29, and an output signal of inverter 24 may be applied to the gate of P-channel MOS transistor 29. However, considering that each of bias potentials VB1, VB2 has first power-supply potential VDD or ground potential GND, this modification will be effective when first power-supply potential VDD is further reduced to be equal to or lower than the built-in potential between P-type well 13 and $N^{+}$-type diffusion layer 15 in FIG. 2.

Second Embodiment

Figure 6:
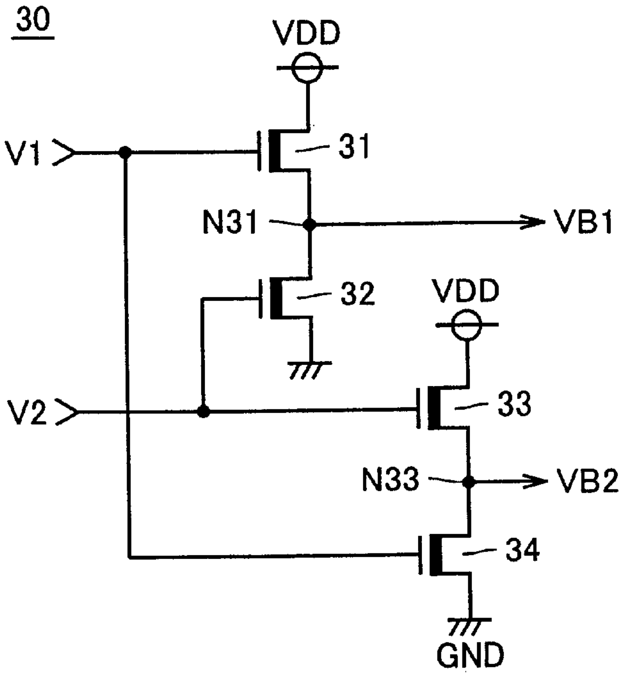
FIG. 6 is a circuit diagram showing the configuration of a bias potential generation circuit of a level conversion circuit according to the second embodiment of the present invention.

FIG. 6 is a circuit diagram showing a substantial part of a level conversion circuit according to the second embodiment of the present invention. Referring to FIG. 6, this level conversion circuit is different from the level conversion circuit in the first embodiment in that bias potential generation circuit 20 is replaced by a bias potential generation circuit 30.

Bias potential generation circuit 30 includes N-channel MOS transistors 31 to 34. Each of N-channel MOS transistors is a thin film transistor. N-channel MOS transistors 31 and 33 are connected between the lines of first power-supply potential VDD and output nodes N31, N33 respectively, the gates thereof receiving signals V1 and V2, respectively. N-channel MOS transistors 32 and 34 are connected, respectively, between output nodes N31, N33 and the lines of ground potential GND, the gates thereof receiving signals V2 and V1, respectively.

When signals V1, V2 are at the "H" level and the "L" level respectively, N-channel MOS transistors 31, 34 are rendered conductive while N-channel MOS transistors 32, 33 are rendered non-conductive. Bias potentials VB1, VB2 than have VDD-VTHL and GND, respectively. When signals V1, V2 are at the "L" level and the "H" level respectively, N-channel MOS transistors 32, 33 are rendered conductive while N-channel MOS transistors 31, 34 are rendered non-conductive. Bias potentials VB1, VB2 then have GND and VDD-VTHL, respectively.

The second embodiment can also have the same effect as that in the first embodiment. In addition, the feedback loop from signals VO, /VO is eliminated, so that the operating speed can be increased compared to that of the first embodiment.

Third Embodiment

Figure 7:
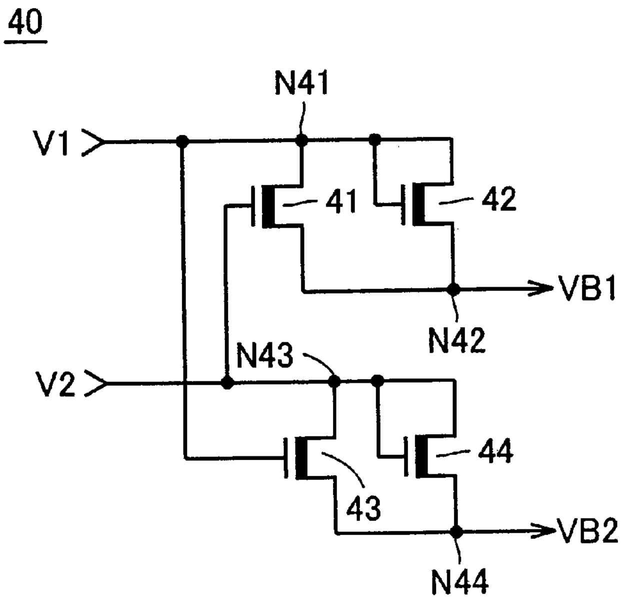
FIG. 7 is a circuit diagram showing the configuration of a bias potential generation circuit of a level conversion circuit according to the third embodiment of the present invention.

FIG. 7 is a circuit diagram showing a substantial part of a level conversion circuit according to the third embodiment of the present invention. Referring to FIG. 7, this level conversion circuit is different from the level conversion circuit of the first embodiment in that bias potential generation circuit 20 is replaced by a bias potential generation circuit 40.

Bias potential generation circuit 40 includes N-channel MOS transistors 41 to 44. Each of N-channel MOS transistors 41 to 44 is a thin film transistor. Signals V1, V2 are input into input nodes N41, N43 respectively. Bias potentials VB1, VB2 are output from output nodes N42, N44 respectively. N-channel MOS transistor 41 is connected between nodes N41 and N42, the gate thereof being connected to node N43. N-channel MOS transistor 42 is connected between nodes N41 and N42, the gate thereof being connected to node N41. N-channel MOS transistor 43 is connected between nodes N43 and N44, the gate thereof being connected to node N41. N-channel MOS transistor 44 is connected between nodes N43 and N44, the gate thereof being connected to node N43. Each of N-channel MOS transistors 42 and 44 forms a diode element.

When signals V1, V2 are at the "H" level (VDD) and the "L" level (GND) respectively, N-channel MOS transistor 41 is rendered non-conductive while N-channel MOS transistor 43 is rendered conductive. Bias potentials VB1, VB2 then have VDD-VTHL and GND, respectively. When signals V1 and V2 are at the "L" level (GND) and the "H" level (VDD) respectively, N-channel MOS transistor 41 is rendered conductive while N-channel MOS transistor 43 is rendered non-conductive. Bias potentials VB1, VB2 then have GND and VDD-VTHL, respectively.

The third embodiment can have the same effect as that in the first embodiment.

Fourth Embodiment

Figure 8:
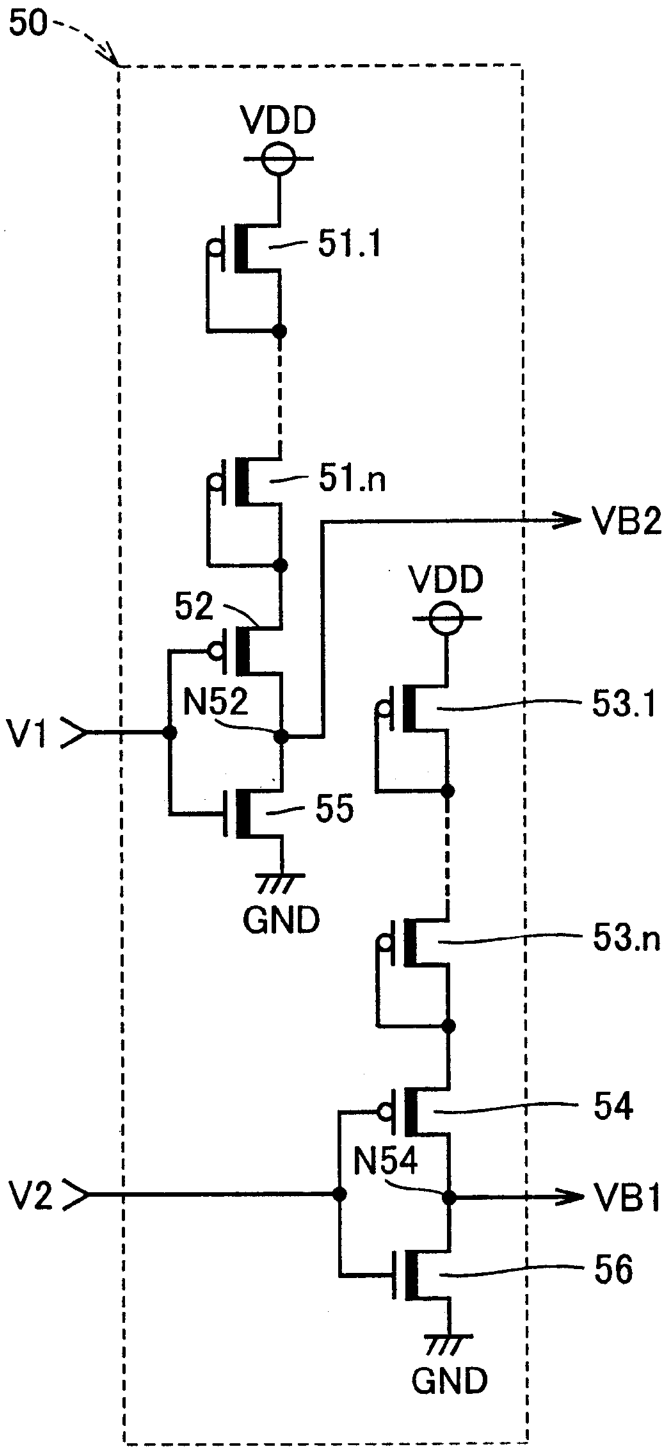
FIG. 8 is a circuit diagram showing the configuration of a bias potential generation circuit of a level conversion circuit according to the fourth embodiment of the present invention.

FIG. 8 is a circuit diagram showing a substantial part of a level conversion circuit according to the fourth embodiment of the present invention. Referring to FIG. 8, this level conversion circuit is different from the level conversion circuit of the first embodiment in that bias potential generation circuit 20 is replaced by a bias potential generation circuit 50.

Bias potential generation circuit 50 includes P-channel MOS transistors 51.1 to 51.n, 52, 53.1 to 53.n, 54, and N-channel MOS transistors 55,56. Here, n is a natural number. Each of MOS transistors 51.1 to 51.n, 52, 53.1 to 53.n, 54 to 56 is a thin film transistor. MOS transistors 51.1 to 51.n, 52 and 55 are connected in series between the line of first power-supply potential VDD and the line of ground potential GND. MOS transistors 53.1 to 53.n, 54 and 56 are connected in series between the line of first power-supply potential VDD and the line of ground potential GND. The gates of P-channel MOS transistors 51.1 to 51.n, 53.1 to 53.n are connected to their respective drains. Each of P-channel MOS transistors 51.1 to 51.n, and 53.1 to 53.n forms a diode element. The gates of MOS transistors 52 and 55 both receive signal V1, whereas the gates of MOS transistors 54 and 56 both receive signal V2. The potential appearing at node N52 between MOS transistors 52 and 55 is bias potential VB2. The potential appearing at node N54 between MOS transistors 54 and 56 is bias potential VB1.

When signals V1, V2 are at the "H" level and the "L" level respectively, MOS transistors 51.1 to 51.n, 52 and 56 are rendered non-conductive, while MOS transistors 53.1 to 53.n, 54 and 55 are rendered conductive. Bias potentials VB1 and VB2 then have VDD-n×VTHL and GND, respectively. When signals V1, V2 are at the "L" level and the "H" level respectively, MOS transistors 53.1 to 53.n, 54 and 55 are rendered non-conductive, while MOS transistors 51.1 to 51.n, 52 and 56 are rendered conductive. Bias potentials VB1, VB2 then have GND and VDD-n×VTHL, respectively.

According to the fourth embodiment, the same effect as that in the first embodiment can be obtained. In addition, adjustment of the number of P-channel MOS transistors n can prevent bias potentials VB1, VB2 from exceeding a built-in potential of a parasitic diode (a diode formed by P-type well 13 and $N^+$-type diffusion layer 15) in each of N-channel MOS transistors 5, 6.

Fifth Embodiment

Figure 9:
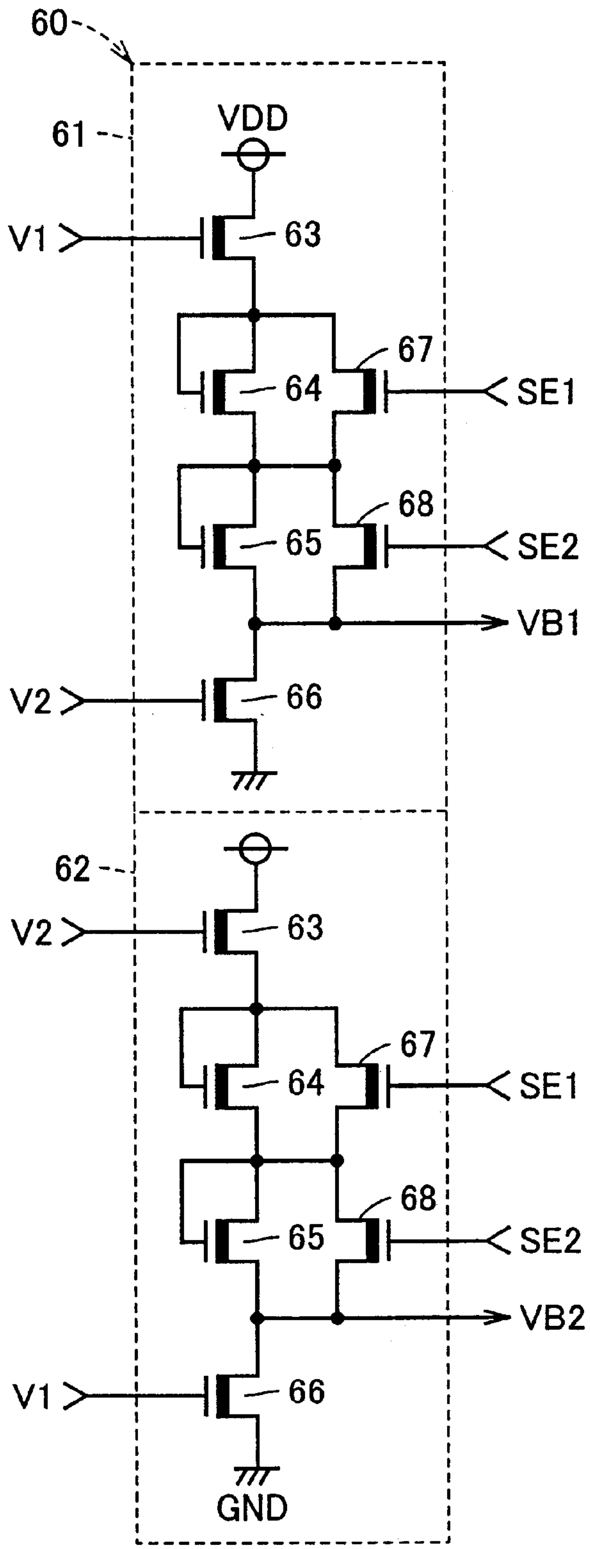
FIG. 9 is a circuit diagram showing the configuration of a bias potential generation circuit of a level conversion circuit according to the fifth embodiment of the present invention.

FIG. 9 is a circuit diagram showing a substantial part of a level conversion circuit according to the fifth embodiment of the present invention. Referring to FIG. 9, this level conversion circuit is different from the level conversion circuit of the first embodiment in that bias potential generation circuit 20 is replaced by a bias potential generation circuit 60. Bias potential generation circuit 60 includes a VB1 generation circuit 61 and a VB2 generation circuit 62.

VB1 generation circuit 61 includes N-channel MOS transistors 63 to 68. Each of N-channel MOS transistors 63 to 68 is a thin film transistor. N-channel MOS transistors 63 to 66 are connected in series between the line of first power-supply potential VDD and the line of ground potential GND. N-channel MOS transistors 67, 68 are connected parallel with N-channel MOS transistors 64 and 66, respectively. The gates of N-channel MOS transistors 63, 66 receive signals V1 and V2, respectively. The gates of N-channel MOS transistors 64, 65 are connected to their respective drains. Each of N-channel MOS transistors 64, 65 forms a diode element. The gates of N-channel MOS transistors 67, 68 receive selection signals SE1 and SE2, respectively. The potential appearing at the node between N-channel MOS transistors 65 and 66 is bias potential VB1. VB2 generation circuit 62 has the same configuration as that of VB1 generation circuit 61. In VB2 generation circuit 62, however, signal V2 is input into the gate of N-channel MOS transistor 63 instead of signal V1, whereas signal V1 is input into the gate of N-channel MOS transistor 66 instead of signal V2. Moreover, bias potential VB2 is output instead of bias potential VB1.

When selection signals SE1, SE2 are both at the "H" level, N-channel MOS transistors 67, 68 are rendered conductive. Each of bias potentials VB1, VB2 then has VDD-VTHL or GND. When selection signals SE1, SE2 are at the "L" level and the "H" level respectively, N-channel MOS transistor 67 is rendered non-conductive while N-channel MOS transistor 68 is rendered conductive. Each of bias potentials VB1, VB2 then has VDD-2VTHL or GND. When selection signals SE1, SE2 are both at the "L" level, N-channel MOS transistors 67, 68 are rendered non-conductive. Each of bias potentials VB1, VB2 then has VDD-3VTHL or GND. Selection signals SE1, SE2 can externally be adjusted and set even after a chip having the level conversion circuit mounted thereon is assembled.

Assuming, for instance, that selection signals SE1, SE2 are set at the "L" level and the "H" level, respectively. When signals V1, V2 are at the "H" level and the "L" level respectively, N-channel MOS transistor 63 is rendered conductive while N-channel MOS transistor 66 is rendered non-conductive in VB1 generation circuit 61. Bias potential VB1 then has VDD-2VTHL. Moreover, N-channel MOS transistor 66 is rendered conductive while N-channel MOS transistor 63 is rendered non-conductive in VB2 generation circuit 62. Bias potential VB2 then has ground potential GND. When signals V1, V2 are at the "L" level and the "H" level, N-channel MOS transistor 66 is rendered conductive while N-channel MOS transistor 63 is rendered non-conductive in VB1 generation circuit 61. Bias potential VB1 then has ground potential GND. In addition, N-channel MOS transistor 63 is rendered conductive while N-channel MOS transistor 66 is rendered non-conductive in VB2 generation circuit 62. Bias potential VB2 then has VDD-VTHL.

According to the fifth embodiment, in addition to the same effect obtained as that of the first embodiment, the levels of bias potentials VB1, VB2 can be adjusted and set even after assembly.

Figure 10:
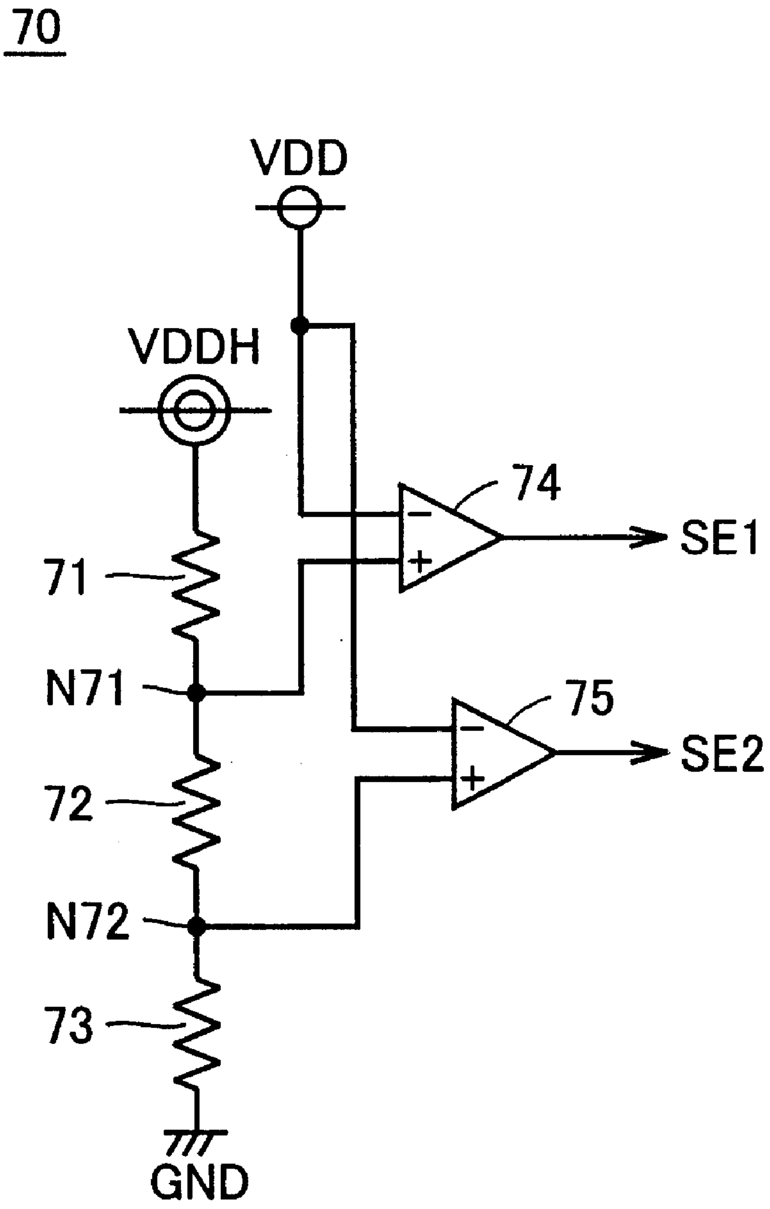
FIG. 10 is a circuit diagram showing a modification of the fifth embodiment.

FIG. 10 is a circuit diagram showing a modification of the fifth embodiment. In the modification, a signal generation circuit 70 is added that generates selection signals SE1, SE2 in accordance with the level of first power-supply potential VDD. In FIG. 10, signal generation circuit 70 includes resistance elements 71 to 73 and comparators 74, 75. Resistance elements 71 to 73 are connected in series between the line of second power-supply potential VDDH and the line of ground potential GND. Potentials obtained by dividing second power-supply potential VDDH by resistance elements 71 to 73 appear at node N71 between resistance elements 71 and 72, and at node N72 between resistance elements 72 and 73.

Comparator 74 sets selection signal SE1 at the "L" level when first power-supply potential VDD is higher than the potential at node N71, whereas it sets selection signal SE1 at the "H" level when first power-supply potential VDD is lower than the potential at node N71. Comparator 75 sets selection signal SE2 at the "L" level when first power-supply potential VDD is higher than the potential at node N72, whereas it sets selection signal SE2 at the "H" level when first power-supply potential VDD is lower than the potential at node N72.

If first power-supply potential VDD is relatively high, bias potentials VB1, VB2 may have low levels, so that selection signals SE1, SE2 are set at the "L" level. If first power-supply potential VDD is relatively low, bias potentials VB1, VB2 must have high levels in order to lower threshold voltage VTHH of N-channel MOS transistors 5 and 6, so that selection signals SE1, SE2 are set at the "H" level. In this modification, the levels of bias potentials VB1, VB2 are controlled in accordance with the level of first power-supply potential VDD.

Sixth Embodiment

Figure 11:
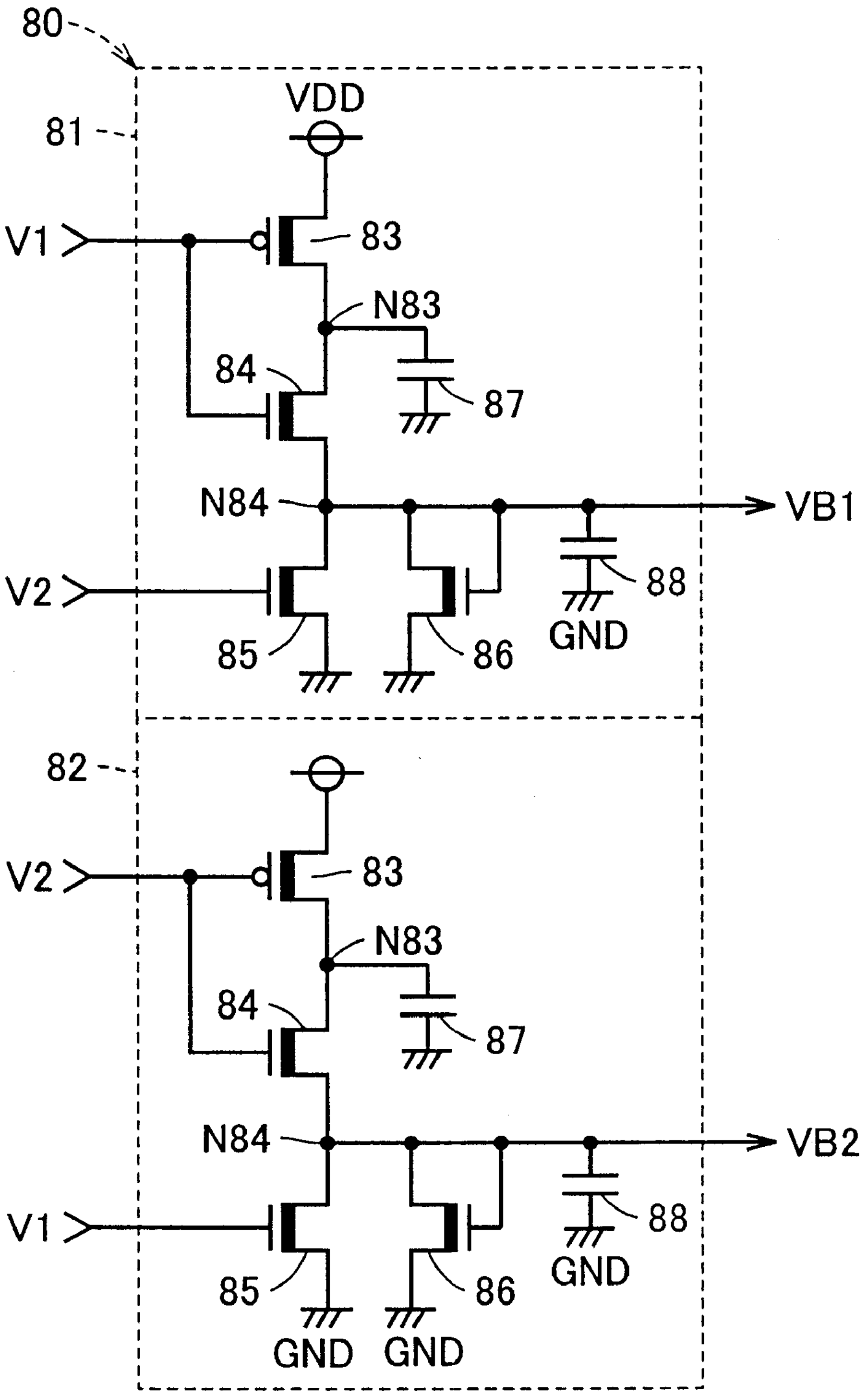
FIG. 11 is a circuit diagram showing the configuration of a bias potential generation circuit of a level conversion circuit according to the sixth embodiment of the present invention.

FIG. 11 is a circuit diagram showing a substantial part of a level conversion circuit according to the sixth embodiment of the present invention. Referring to FIG. 11, this level conversion circuit is different from the level conversion circuit of the first embodiment in that bias potential generation circuit 20 is replaced by a bias potential generation circuit 80. Bias potential generation circuit 80 includes a VB1 generation circuit 81 and a VB2 generation circuit 82.

VB1 generation circuit 81 includes a P-channel MOS transistor 83, N-channel MOS transistors 84 to 86, and a capacitor 87. Each of MOS transistors 83 to 86 is a thin film transistor. A parasitic capacitance 88 is connected to an output node N84. P-channel MOS transistor 83 and N-channel MOS transistor 84 are connected between the line of first power-supply potential VDD and output node N84, the gates thereof both receiving signal V1. Capacitor 87 is connected between node N83 disposed between MOS transistors 83 and 84, and the line of ground potential GND. N-channel MOS transistor 85 is connected between output node N84 and the line of ground potential GND, the gate thereof receiving signal V2. N-channel MOS transistor 86 is connected between output node N84 and the line of ground potential GND, the gate thereof being connected to output node N84. N-channel MOS transistor 86 forms a diode element. VB2 generation circuit 82 has the same configuration as that of VB1 generation circuit 81. In VB generation circuit 82, however, signal V2 is input into the gate of P-channel MOS transistor 83 instead of signal V1, whereas signal V1 is input into the gate of N-channel MOS transistor 85 instead of signal V2. Moreover, bias potential VB2 is output instead of bias potential VB1.

Figure 12:
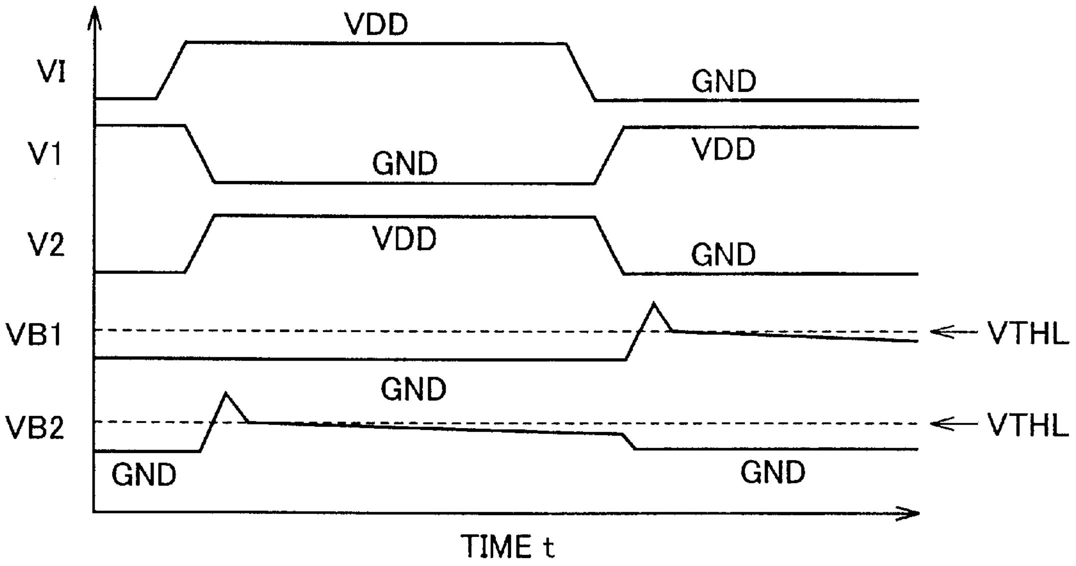
FIG. 12 is a time chart showing an operation of the bias potential generation circuit shown in FIG. 11.

FIG. 12 is a time chart illustrating the operation of bias potential generation circuit 80 shown in FIG. 11. In the initial state, input signal VI is set at the "L" level, and signals V1, V2 are at the "H" level and the "L" level, respectively. Here, MOS transistors 83 and 85 in VB1 generation circuit 81 are rendered non-conductive while MOS transistor 84 is rendered conductive, output node N84 being discharged to ground potential GND by leak current. Moreover, MOS transistors 83, 85 are rendered conductive while MOS transistor 84 is rendered non-conductive in VB2 generation circuit 82, capacitor 87 being charged to first power-supply voltage VDD, output node N84 being set at ground potential GND.

When input signal VI is raised to the "H" level at a certain time, signals V1, V2 are set at the "L" level and the "H" level respectively. Here, in VB1 generation circuit 81, MOS transistor 84 is rendered non-conductive while MOS transistors 83, 85 are rendered conductive. In addition, capacitor 87 is charged to first power-supply voltage VDD, while output node N84 is set at ground potential GND. Moreover, in VB2 generation circuit 82, MOS transistors 83, 85 are rendered non-conductive while MOS transistor 84 is rendered conductive. The charge at capacitor 87 is distributed to parasitic capacitance 88 and the gate capacitance of N-channel MOS transistor 86. When bias potential VB2 is higher than threshold voltage VTHL of N-channel MOS transistor 86, N-channel MOS transistor 86 is rendered conductive. Thus, bias potential VB1 is raised in a pulsive manner to VTHL, and then gradually decreases by leak current.

Next, when input signal VI is lowered to the "L" level, signals V1, V2 are set at the "H" level and the "L" level respectively. Here, in VB1 generation circuit 81, MOS transistors 83, 85 are rendered non-conductive while MOS transistor 84 is rendered conductive, and the charge at capacitor 87 is distributed to parasitic capacitance 88 and the gate capacitance of N-channel MOS transistor 86. When bias potential VB1 is higher than threshold potential VTHL of N-channel MOS transistor 86, N-channel MOS transistor 86 is rendered conductive. Thus, bias potential VB1 is raised in a pulsive manner to VTHL, and then gradually decreases by leak current. Further, in VB2 generation circuit 82, MOS transistor 84 is rendered non-conductive while MOS transistors 83, 85 are rendered conductive. Capacitor 87 is charged to first power-supply voltage VDD, while output node N84 is set at ground potential GND.

In the sixth embodiment, bias potentials VB1, VB2 are not the potentials down-converted from first power-supply potential VDD, but the potentials boosted from ground potential GND by VTHL. Thus, bias potentials VB1, VB2 are less affected by the change in first power-supply potential VDD, so that the circuit operation can be stabilized.

Seventh Embodiment

Figure 13:
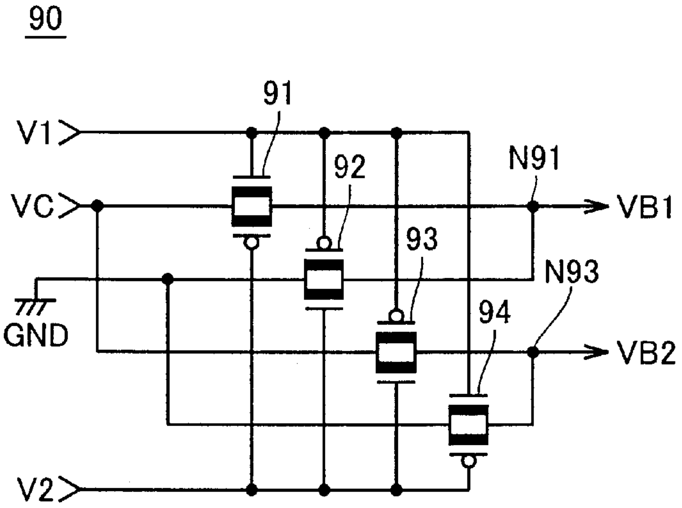
FIG. 13 is a circuit diagram showing the configuration of a switching circuit of a level conversion circuit according to the seventh embodiment of the present invention.

FIG. 13 is a circuit diagram showing a substantial part of a level conversion circuit according to the seventh embodiment of the present invention. Referring to FIG. 13, this level conversion circuit is different from the level conversion circuit of the first embodiment in that bias potential generation circuit 20 is replaced by a switching circuit 90.

Switching circuit 90 includes transfer gates 91 to 94. Each of transfer gates 91 to 94 includes an N-channel MOS transistor and a P-channel MOS transistor connected in parallel. Each of the N-channel MOS transistor and P-channel MOS transistor is a thin film transistor. Each of transfer gates 91, 93 has one electrode receiving an externally-applied constant potential VC, and the other electrode connected to output node N91 or N93. Constant potential V1 is a positive potential equal to or lower than the built-in potential between P-type well 13 and $N^+$-type diffusion layer 15 in FIG. 2. Signals appearing at output nodes N91, N93 have bias potentials VB1, VB2. Each of transfer gates 92, 94 has one electrode receiving ground potential GND, and the other electrode connected to output node N91 or N93. Signal V1 is input into the gates on the N-channel MOS transistor sides of transfer gates 91, 94, and into the gates on the P-channel MOS transistor sides of transfer gates 92, 93. Signal V2 is input into the gates on the P-channel MOS transistor sides of transfer gates 91, 94, and into the gates on the N-channel MOS transistor sides of transfer gates 92, 93.

When signals V1, V2 are at the "H" level and the "L" level respectively, transfer gates 91, 94 are rendered conductive while transfer gates 92, 93 are rendered non-conductive. Bias potentials VB1, VB2 then have constant potential VC and ground potential GND, respectively. When signals V1, V2 are at the "L" level and the "H" level respectively, transfer gates 92, 93 are rendered conductive while transfer gates 91, 94 are rendered non-conductive. Bias potentials VB1, VB2 then have ground potential GND and constant potential VC, respectively.

The seventh embodiment can also have the same effect as that of the first embodiment.

Eighth Embodiment

Figure 14:
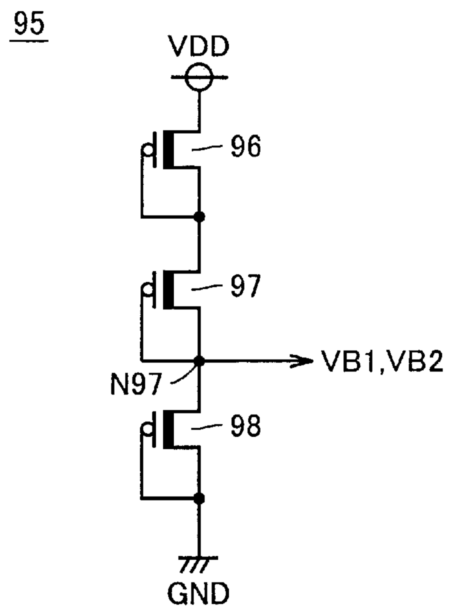
FIG. 14 is a circuit diagram showing the configuration of a bias potential generation circuit of a level conversion circuit according to the eighth embodiment of the present invention.

FIG. 14 is a circuit diagram showing a substantial part of a level conversion circuit according to the eighth embodiment of the present invention. Referring to FIG. 14, this level conversion circuit is different from the level conversion circuit of the first embodiment in that bias potential generation circuit 20 is replaced by a bias potential generation circuit 95.

Bias potential generation circuit 95 includes a plurality of (three in FIG. 14) P-channel MOS transistors 96 to 98 connected in series between the line of first power-supply potential VDD and the line of ground potential GND. Each of P-channel MOS transistors 96 to 98 is a thin film transistor. The gates of P-channel MOS transistors 96 to 98 are connected to their respective drains. Each of P-channel MOS transistors 96 to 98 forms a diode element. Potentials appearing at node N97 between P-channel MOS transistors 97 and 98 are bias potentials VB1, VB2. Bias potentials VB1, VB2 are constant potentials obtained by dividing second power-supply potential VDD by P-channel MOS transistors 96 to 98. Bias potentials VB1, VB2 are positive potentials equal to or lower than the built-in potential between P-type well 13 and $N^+$-type diffusion layer 15 in FIG. 2.

In the eighth embodiment also, threshold potential VTHH of N-channel MOS transistors 5, 6 in FIG. 1 can be lowered, so that the operation speed can be increased even if input signal V1 has a low amplitude voltage. Since bias potentials VB1, VB2 are constant potentials, the configuration of the bias potential generation circuit can be simplified, though leak current increases. It is noted that the output potential of bias potential generation circuit 95 may be set as constant potential VC in FIG. 12.

Ninth Embodiment

Figure 15:
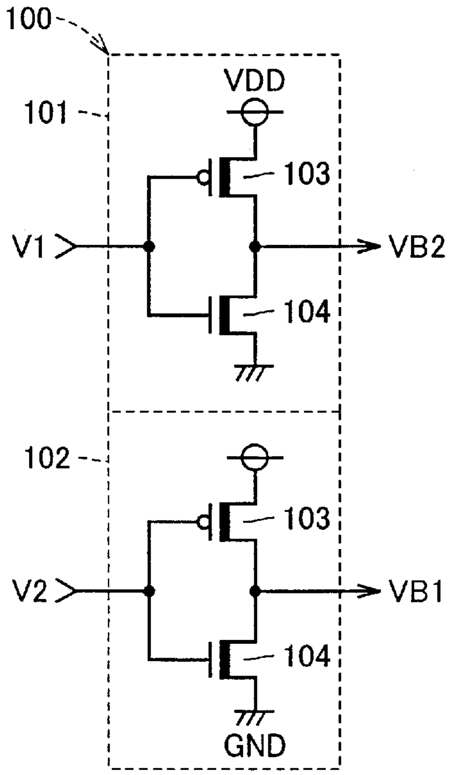
FIG. 15 is a circuit diagram showing the configuration of a switching circuit of a level conversion circuit according to the ninth embodiment of the present invention.

FIG. 15 is a circuit diagram showing a substantial part of a level conversion circuit according to the ninth embodiment of the present invention. Referring to FIG. 15, this level conversion circuit is different from the level conversion circuit of the first embodiment in that bias potential generation circuit 20 is replaced by a switching circuit 100.

Switching circuit 100 includes two inverters 101, 102. Inverter 101 includes a P-channel MOS transistor 103 and an N-channel MOS transistor 104. Each of MOS transistors 103, 104 is a thin film transistor. MOS transistors 103 and 104 are connected in series between the line of first power-supply potential VDD and the line of ground potential GND, the gates thereof both receiving signal V1. A potential appearing at a node between MOS transistors 103 and 104 is bias potential VB2. Inverter 102 has the same configuration as that of inverter 101, which receives signal V2 instead of signal V1 and outputs bias potential VB1 instead of bias potential VB2.

When signals V1, V2 are at the "H" level and "L" level respectively, bias potentials VB1 and VB2 have first power-supply potential VDD and ground potential GND, respectively. When signals V1, V2 are at the "L" level and the "H" level respectively, bias potentials VB1 and VB2 are at ground potential GND and first power-supply potential VDD, respectively. The ninth embodiment will be effective when first power-supply potential VDD is further reduced to be equal to or lower than the built-in potential between P-type well 13 and $N^+$-type diffusion layer 15 in FIG. 2.

The ninth embodiment has the same effect as that in the first embodiment.

Tenth Embodiment

Figure 16:
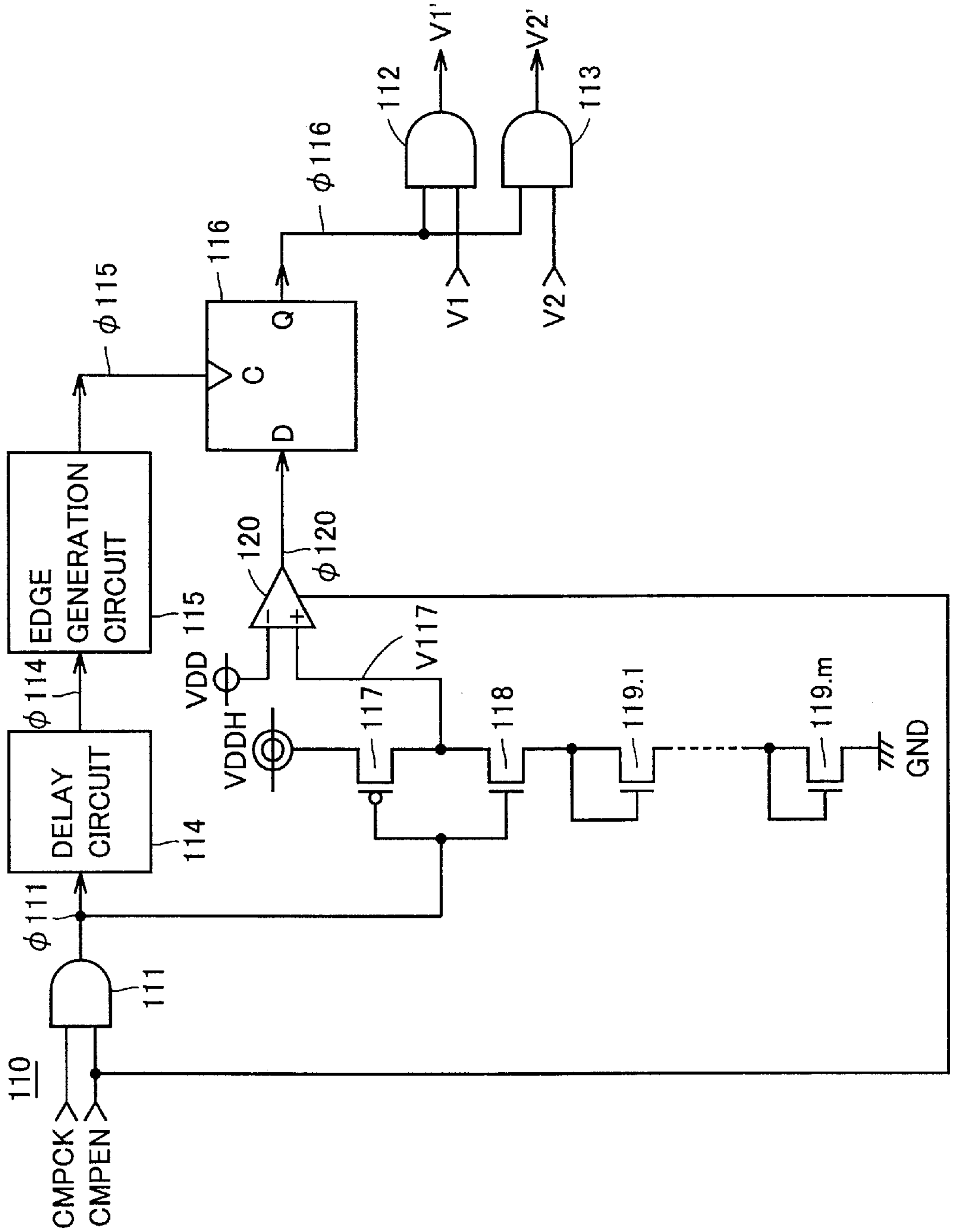
FIG. 16 is a circuit block diagram showing the configuration of a control circuit of a level conversion circuit according to the tenth embodiment of the present invention.

FIG. 16 is a circuit block diagram showing a substantial part of a level conversion circuit according to the tenth embodiment. Referring to FIG. 16, this level conversion circuit is different from the level conversion circuit of the first embodiment in that a determination circuit 110 is further added.

Determination circuit 110 includes AND gates 111 to 113, a delay circuit 114, an edge generation circuit 115, a latch circuit 116, a P-channel MOS transistor 117, N-channel MOS transistors 118, 119.1 to 119.m (where m is a natural number) and a comparator 120. AND gate 111 receives a clock signal CMPCK and a signal CMPEN, and outputs a signal φ111. Delay circuit 114 delays output signal φ111 of AND gate 111 by a prescribed time period. Edge generation circuit 115 shapes an output signal φ114 of delay circuit 114 to generate a signal φ115 having a sharp edge. Signal φ115 is applied to a clock terminal C of latch circuit 116.

P-channel MOS transistor 117 and N-channel MOS transistors 118, 119.1 to 119.m are connected in series between the line of second power-supply potential VDDH and the line of ground potential GND. Each of MOS transistors 117, 118, 119.1 to 119.m is a thick film transistor. The gates of MOS transistors 117, 118 receive output signal φ111 of AND gate 111. The gates of N-channel MOS transistors 119.1 to 119.m are connected to their respective drains. Each of N-channel MOS transistors 119.1 to 119.m forms a diode element. Comparator 120 compares first power-supply potential VDD with a potential V117 at a node between MOS transistors 117 and 118. If VDD is higher than V117, comparator 120 sets a signal φ120 at the "L" level, whereas if VDD is lower than V117, it sets signal φ120 at the "H" level. Signal φ120 is applied to an input terminal D of latch circuit 116.

Latch circuit 116 allows signal φ120, which is applied to input terminal D during a period in which signal φ115 applied to clock terminal C is at the "L" level, to pass through (through state), and holds and outputs the level of input signal φ120 in response to signal φ115 being changed from the "L" level to "H" level (hold state). An output signal $\phi$116 of latch circuit 116 is applied to one input node of each of AND gates 112, 113. Signals V1, V2 are input into the other input node of each of AND gates 112, 113. Output signals V1', V2' of AND gates 112, 113 are input into VB2 generation circuit 21 and VB1 generation circuit 22 in FIG. 3, in place of signals V1, V2.

When signal CMPEN is at the "L" level, output signal $\phi$111 of AND gate 111 is fixed at the "L" level. Accordingly, output signal $\phi$114 of delay circuit 114 and output signal $\phi$115 of edge generation circuit 115 are also set at the "L" level, while latch circuit 116 is fixed in the through state. Moreover, P-channel MOS transistor 117 is rendered conductive while N-channel MOS transistor 118 is rendered non-conductive, V117 being second power-supply potential VDDH. Further, comparator 120 is deactivated to set signal $\phi$120 at the "L" level. Thus, output signal $\phi$116 of latch circuit 116 is at the "L" level, and hence output signals V1', V2' of AND gates 112, 113 are fixed at the "L" level. Accordingly, bias potentials VB1, VB2 are fixed at ground potential GND.

When signal CMPEN is set at the "H" level, clock signal CMPCK passes through AND 111 to be signal $\phi$111, and comparator 120 is activated. In the period during which clock signal CMPCK is at the "L" level, signals V1' and V2' are fixed at the "L" level, as in the case where signal CMPEN is at the "L" level, except that comparator 120 is activated to set signal $\phi$120 at the "L" level.

When clock signal CMPCK is raised from the "L" level to the "H" level, output signal $\phi$111 of AND gate 111 is at the "H" level, rendering P-channel MOS transistor 117 non-conductive and N-channel MOS transistor 118 conductive, V117 being m×VTHH. If VDD is higher than m×VTHH, output signal $\phi$120 of comparator 120 is at the "L" level. If VDD is lower than m×VTHH, signal $\phi$120 is at the "H" level. An output signal $\phi$115 of edge generation circuit 115 is raised to the "H" level after a prescribed time has elapsed since clock signal CMPCK had been raised to the "H" level. Latch circuit 116 holds and outputs the level of signal $\phi$120.

Accordingly, if VDD is higher than m×VTHH, there is no need to lower threshold voltage VTHH of N-channel MOS transistors 5, 6 in FIG. 1, so that signal $\phi$116 is at the "L" level to fix signals V1', V2' at the "L" level. If VDD is lower than m×VTHH, threshold voltage VTHH of N-channel MOS transistors 5, 6 must be lowered, so that $\phi$116 is at the "H" level, to allow signal V1, V2 to pass through AND gates 112, 113 to be signals V1', V2'.

According to the tenth embodiment, the bias generation circuit is operated only when VDD is lower than m×VTHH, i.e., only when threshold voltage VTHH of N-channel MOS transistors 5, 6 must be lowered, so that unnecessary power consumption can be reduced.

Eleventh Embodiment

Figure 17:
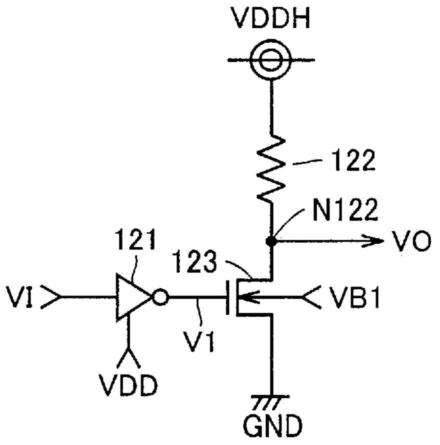
FIG. 17 is a circuit diagram showing a substantial part of a level conversion circuit according to the eleventh embodiment of the present invention.

FIG. 17 is a circuit diagram showing a substantial part of a level conversion circuit according to the eleventh embodiment of the present invention. In FIG. 17, this level conversion circuit includes an inverter 121, a resistance element 122 and an N-channel MOS transistor 123. Inverter 121 is driven by first power-supply voltage VDD, inverting input signal VI to generate signal V1. Resistance element 122 and N-channel MOS transistor 123 are connected in series between the line of second power-supply potential VDDH and the line of ground potential GND. The gate of N-channel MOS transistor 123 receives signal V1, the backgate thereof receiving bias potential VB1. N-channel MOS transistor 123 is a thick film transistor. Bias potential VB1 may be generated by any one of bias potential generation circuits in the first to the tenth embodiments, while signal VI is input instead of signal V2. A signal appearing at a node N122 between resistance element 122 and N-channel MOS transistor 123 is an output signal VO.

When signal VI is at the "H" level (VDD), N-channel MOS transistor 123 is rendered non-conductive, setting signal VO at the "H" level (VDDH). When signal VI is lowered from the "H" level (VDD) to the "L" level (GND), bias potential VB1 is lowered to e.g. VDD-VTHL, lowering threshold potential VTHH of N-channel MOS transistor 123. N-channel MOS transistor 123 is then rendered conductive, setting signal VO at the "L" level (GND).

The eleventh embodiment also has the same effect as that in the first embodiment.

Twelfth Embodiment

Figure 18:
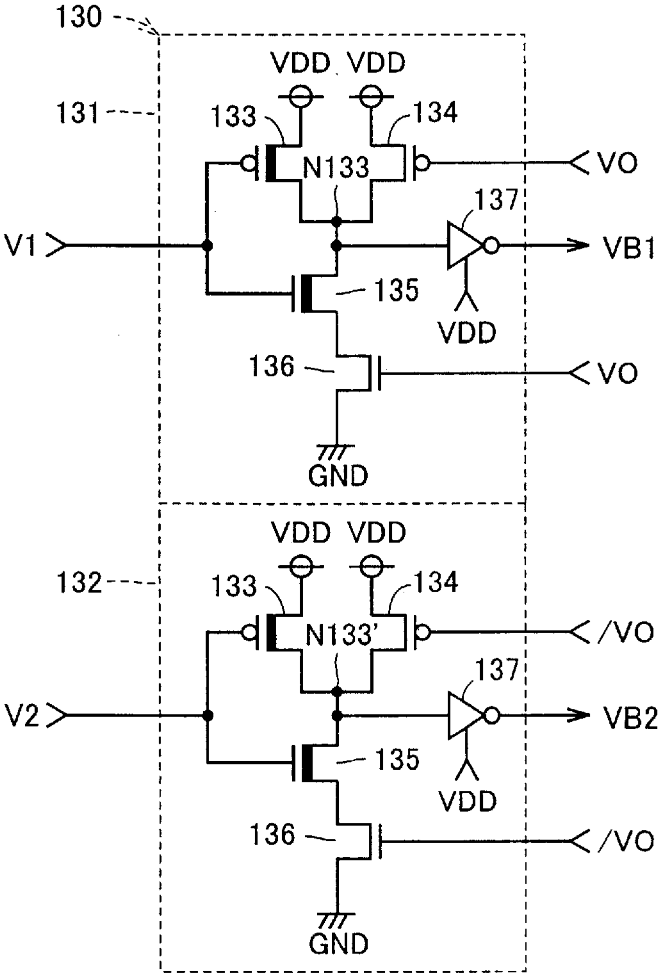
FIG. 18 is a circuit diagram showing the configuration of a bias potential generation circuit of a level conversion circuit according to the twelfth embodiment of the present invention.

FIG. 18 is a circuit diagram showing a substantial part of a level conversion circuit according to the twelfth embodiment of the present invention. Referring to FIG. 18, this level conversion circuit is different from the level conversion circuit in the first embodiment in that bias potential generation circuit 20 is replaced by a bias potential generation circuit 130. Bias potential generation circuit 130 includes a VB1 generation circuit 131 and a VB2 generation circuit 132.

VB1 generation circuit 131 forms an AND gate to output an AND signal between signals V1 and VO as bias potential VB1. Specifically, VB1 generation circuit 131 includes P-channel MOS transistors 133, 134, N-channel MOS transistors 135, 136 and an inverter 137. MOS transistors 133, 135 are thin film transistors while MOS transistors 134, 136 are thick film transistors. Inverter 137 is a well-known one that includes a P-channel MOS transistor and an N-channel MOS transistor connected in series between the line of first power-supply potential VDD and the line of ground potential GND.

P-channel MOS transistors 133 and 134 are connected in parallel between the lines of first power-supply potential VDD and a node N133, having respective gates receiving signals V1 and VO respectively. N-channel MOS transistors 135 and 136 are connected in series between node N133 and the line of ground potential GND, having respective gates receiving signals V1 and VO respectively. MOS transistors 133 to 136 form a NAND gate. Inverter 137 outputs an inversion signal of a signal appearing at node N133 as bias potential VB1. While VB2 generation circuit 132 has the same configuration as that of VB1 generation circuit 131, VB2 generation circuit 132 receives signals V2, /VO instead of signals V1, VO and outputs bias potential VB2 instead of bias potential VB1.

Figure 19:
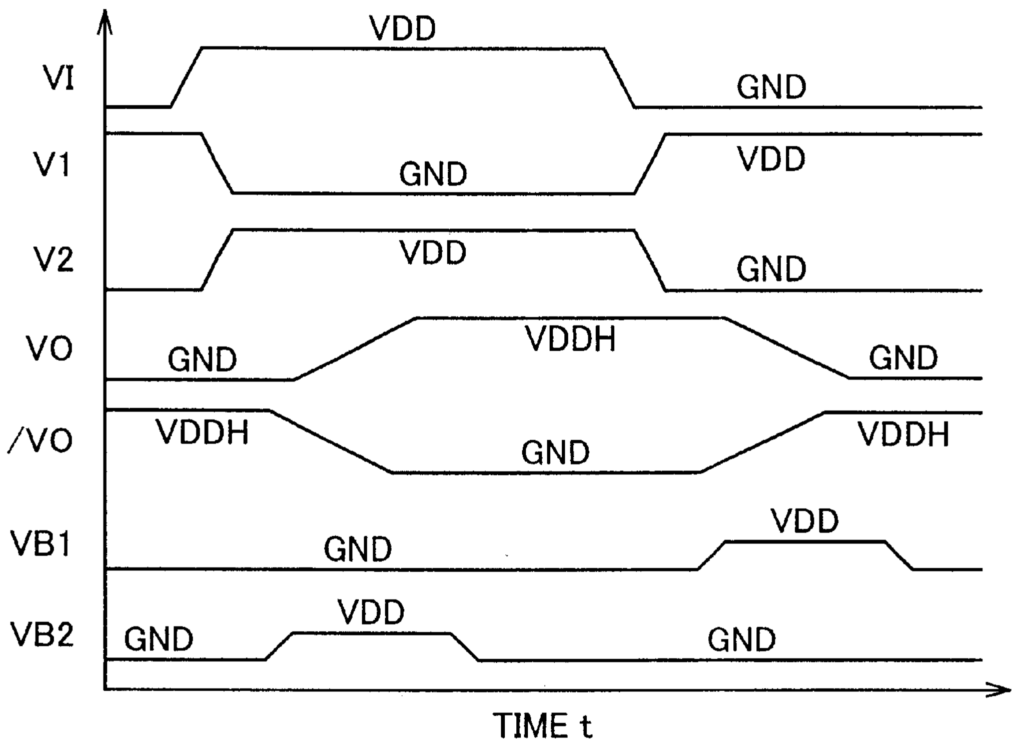
FIG. 19 is a time chart showing an operation of the level conversion circuit shown in FIG. 18.

FIG. 19 is a time chart illustrating the operation of this level conversion circuit. In an initial state, input signal VI is set at the "L" level (GND), while signals V1 and V2 are set at the "H" level (VDD) and the "L" level (GND) respectively. MOS transistors 4, 5 are rendered conductive while MOS transistors 3, 6 are rendered non-conductive. Signals VO and /VO then have the "L" level (GND) and the "H" level (VDDH) respectively. In addition, nodes N133 and N133' both have the "H" level (VDD), while bias potentials VB1 and VB2 both have ground potential GND.

When input signal VI is raised from the "L" level (GND) to the "H" level (VDD) at a certain time, signals V1 and V2 have the "L" level (GND) and the "H" level (VDD) respectively. When signal V1 is set at the "L" level, P-channel MOS transistor 133 of VB1 generation circuit 131 is rendered conductive and N-channel MOS transistor 135 thereof is rendered non-conductive. Bias potential VB1, however, is unchanged and thus stays at the "L" level. Further, when signal V2 is set at the "H" level, P-channel MOS transistor 133 of VB2 generation circuit 132 is rendered non-conductive while N-channel MOS transistor 135 thereof is rendered conductive, node N133' is set to the "L" level and thus bias potential VB2 is raised to first power-supply potential VDD.

VDD is set at a value equal to or lower than the built-in potential between P-type well 13 and $N^+$-type diffusion layer 15 in FIG. 2. When bias potential VB2 is set at VDD, threshold voltage VTHH of N-channel MOS transistor 6 is lowered, rendering N-channel MOS transistor 6 conductive. This gradually lowers the level of signal /VO. When the level of signal /VO is lowered, current flowing in P-channel MOS transistor 3 increases, raising the level of signal VO. When the level of signal VO is raised, current flowing in P-channel MOS transistor 4 decreases, further lowering the level of signal /VO. Thus, signals VO and /VO are set at the "H" level (VDDH) and the "L" level (GND) respectively.

When signals VO and /VO are set at the "H" level (VDDH) and the "L" level (GND) respectively, nodes N133 and N133' both have the "H" level (VDD), and bias potential VB2 is set at ground potential GND. When bias potential VB2 is set at ground potential GND, threshold voltage VTHH of N-channel MOS transistor 6 increases, thereby reducing leak current in N-channel MOS transistor 6.

Next, when input signal VI is lowered from the "H" level (VDD) to the "L" level (GND), signals V1 and V2 have the "H" level (VDD) and the "L" level (GND) respectively. When signal V2 is set at the "L" level, P-channel MOS transistor 133 of VB2 generation circuit 132 is rendered conductive while N-channel MOS transistor 135 thereof is rendered non-conductive. Bias potential VB2, however, is unchanged and thus remains at the "L" level. Moreover, when signal V1 is set at the "H" level, P-channel MOS transistor 133 of VB1 generation circuit is rendered non-conductive while N-channel MOS transistor 135 thereof is rendered conductive. Node N133 is set at the "L" level and bias potential VB1 is raised to first power-supply potential VDD.

When bias potential VB1 is raised to VDD, threshold voltage VTHH of N-channel MOS transistor 5 is lowered, rendering N-channel MOS transistor 5 conductive. This gradually lowers the level of signal VO. When the level of signal VO is lowered, current flowing in P-channel MOS transistor 4 increases, raising the level of signal /VO. When the level of signal /VO is raised, current flowing in P-channel MOS transistor 3 decreases, further lowering the level of signal VO. Thus, signals VO and /VO have the "L" level (GND) and the "H" level (VDDH) respectively.

When signals VO and /VO are set at the "L" level (GND) and the "H" level (VDDH) respectively, P-channel MOS transistor 134 of VB1 generation circuit 131 is rendered conductive while N-channel MOS transistor 136 thereof is rendered non-conductive, raising node N133 to the H level and setting bias potential VB1 at ground potential GND. When bias potential VB1 is set at ground potential GND, threshold voltage VTHH of N-channel MOS transistor 5 increases, thereby reducing leak current in N-channel MOS transistor 5.

The twelfth embodiment can also have the same effect as that in the first embodiment. Various modifications of the twelfth embodiment are hereinafter described. A bias potential generation circuit 140 of a level conversion circuit in FIG. 20 includes a VB1 generation circuit 141 and a VB2 generation circuit 142. VB1 generation circuit 141 and VB2 generation circuit 142 include respective N-channel MOS transistors 143, instead of P-channel MOS transistors 134 respectively of VB1 generation circuit 131 and VB2 generation circuit 132. N-channel MOS transistors 143 are thick film transistors. N-channel MOS transistor 143 of VB1 generation circuit 141 is connected between the line of first power-supply potential VDD and node N133, having its gate receiving signal /VO. N-channel MOS transistor 143 of VB2 generation circuit 142 is connected between the line of first power-supply potential VDD and node N133', having its gate receiving signal VO.

Figure 20:
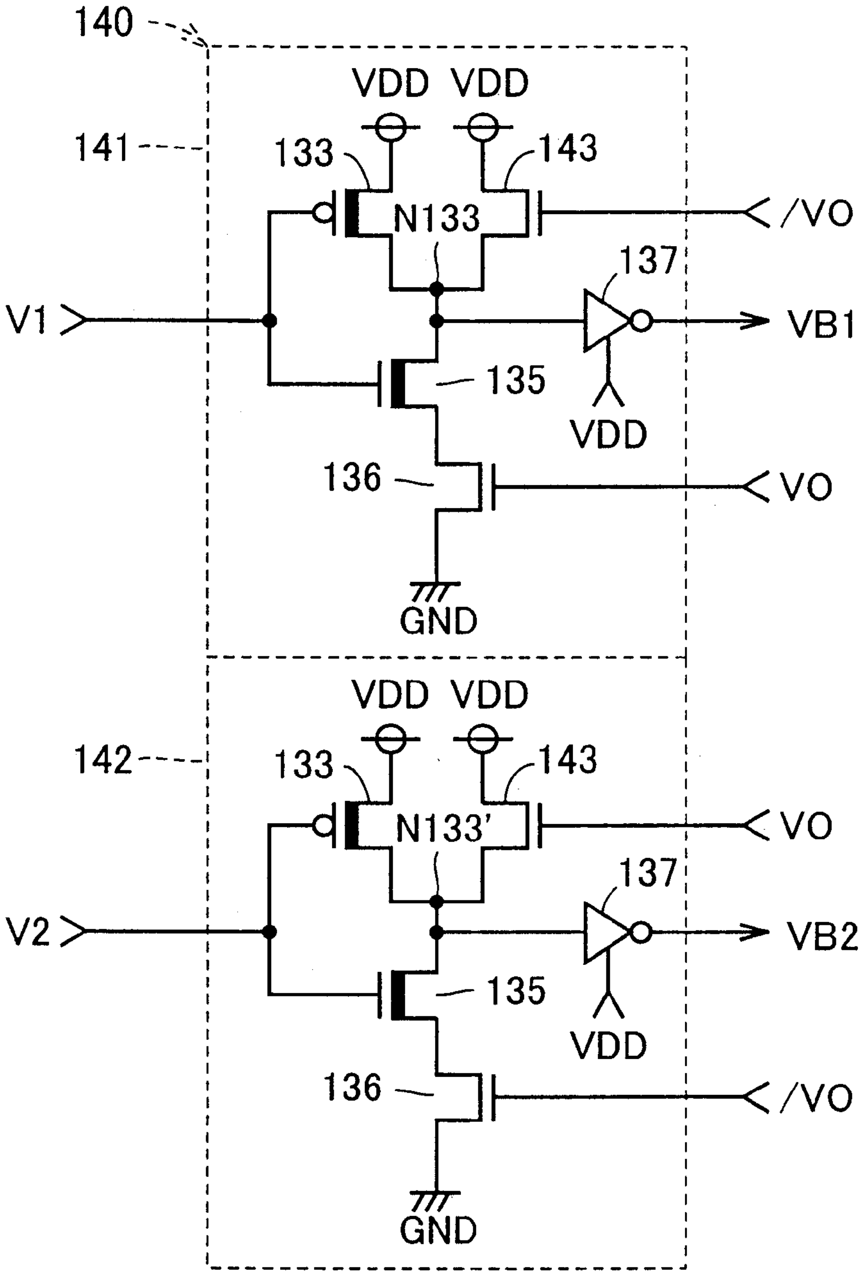
FIG. 20 is a circuit diagram showing a modification of the twelfth embodiment.

This bias potential generation circuit 140 thus operates similarly to bias potential generation circuit 130 in FIG. 18, except that bias potential generation circuit 130 in FIG. 18 achieves a high-speed operation when first power-supply potential VDD is sufficiently higher than threshold voltage VTHH of P-channel MOS transistor 134 while bias potential generation circuit 140 in FIG. 20 achieves a high-speed operation when VDDH-VDD is sufficiently higher than threshold voltage VDHH of N-channel MOS transistor 143. In other words, bias potential generation circuit 130 in FIG. 18 is effective when first power supply potential VDD is a relatively high potential while bias potential generation circuit 140 in FIG. 20 is effective when first power supply potential VDD is a relatively low potential.

Figure 21:
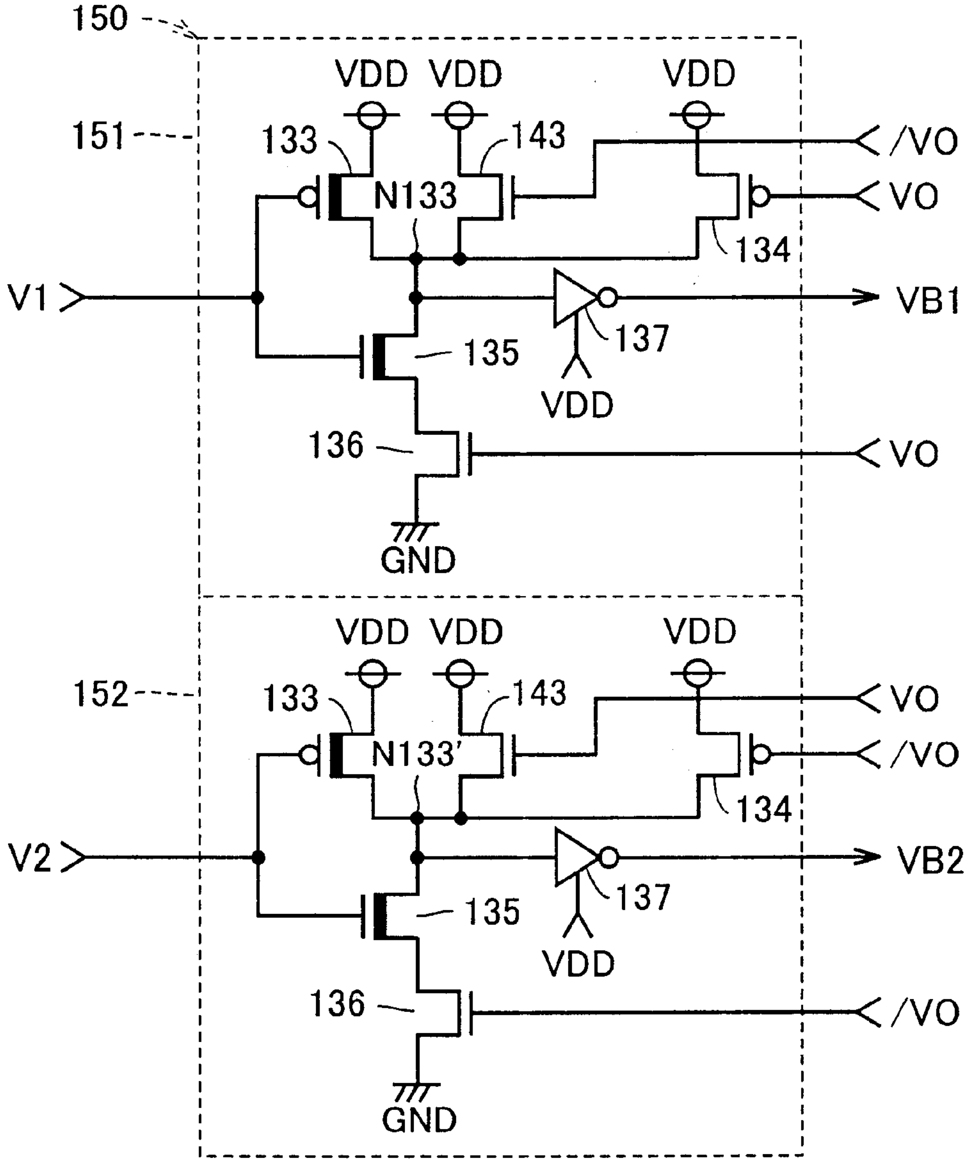
FIG. 21 is a circuit diagram showing another modification of the twelfth embodiment.

A bias potential generation circuit 150 of a level conversion circuit in FIG. 21 includes a VB1 generation circuit 151 and a VB2 generation circuit 152. VB1 generation circuit 151 and VB2 generation circuit 152 additionally include respective N channel MOS transistors 143 as compared with VB1 generation circuit 131 and VB2 generation circuit 132 respectively. N-channel MOS transistors 143 are thick film transistors. N-channel MOS transistor 143 of VB1 generation circuit 151 is connected between the line of first power-supply potential VDD and node N133, having its gate receiving signal /VO. N-channel MOS transistor 143 of VB2 generation circuit 152 is connected between the line of first power supply potential VDD and node N133', having its gate receiving signal VO. This bias potential generation circuit 150 thus operates similarly to bias potential generation circuit 130 in FIG. 18. While bias potential generation circuit 130 in FIG. 18 is effective when first power-supply potential VDD is a relatively high potential and bias potential generation circuit 140 in FIG. 20 is effective when first power-supply potential VDD is a relatively low potential, bias potential generation circuit 150 in FIG. 21 achieves a high-speed operation regardless of the potential level of first power supply potential VDD.

Figure 22:
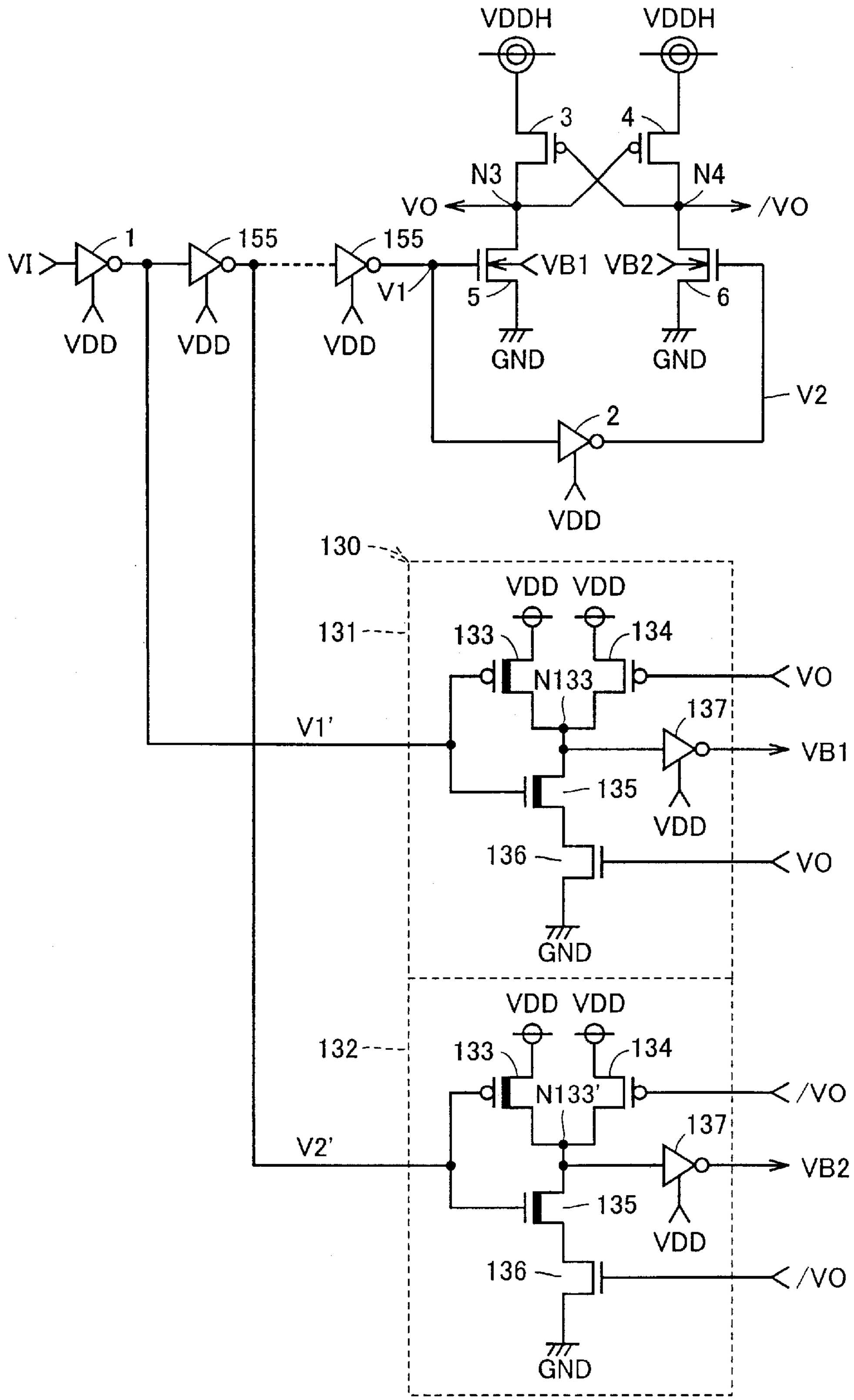
FIG. 22 is a circuit diagram showing still another modification of the twelfth embodiment.

A level conversion circuit in FIG. 22 additionally includes k (k is an even number) stages of inverters 155 connected in series between inverter 1 and the gate of N-channel MOS transistor 5 of the level conversion circuit in FIG. 18. An output signal of inverter 1 is input, as a signal V1', to respective gates of MOS transistors 133 and 135 of VB1 generation circuit 131, and an output signal of inverter 155 in the stage subsequent to inverter 1 is input, as a signal V2', to respective gates of MOS transistors 133 and 135 of VB2 generation circuit 132. Suppose that a delay time per stage of the inverters is Td, signals V1' and V2' change in level earlier than signals V1 and V2 by k×Td. Accordingly, the timing of change in level of bias potentials VB1 and VB2 can be made earlier. Further, the number k of stages of inverters 155 can be adjusted to allow a change in level of signals V1 and V2 to coincide with a change in level of bias potentials VB1 and VB2. As first power-supply potential VDD is lower, the operating speed of internal circuitry decreases. For this reason, this modification is more effective as first power-supply potential is lower.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level conversion circuit converting a first signal having one level at a reference potential and the other level at a first potential higher than said reference potential into a second signal having one level at said reference potential and the other level at a second potential higher than said first potential, to output the converted signal to an output node, comprising:

a load circuit connected between a line of said second potential and said output node;

a first N-type transistor having a drain connected to said output node, a source connected to a line of said reference potential, and a gate receiving said first signal; and a bias potential generation circuit having at least one transistor rendered conductive/non-conductive in response to said first signal and generating a bias potential higher than said reference potential and at most said first potential, to apply the bias potential to a backgate of said first N-type transistor, in response to said first signal being set at said first potential.

2. The level conversion circuit according to claim 1, wherein said bias potential is at most a built-in potential of a PN junction between the backgate and the source of said first N-type transistor.

3. The level conversion circuit according to claim 1, wherein said bias potential generation circuit includes a level shift circuit shifting a level of said first potential to said reference potential side to generate said bias potential.

4. The level conversion circuit according to claim 3, wherein said level shift circuit includes a second N-type transistor connected between a line of said first potential and the backgate of said first n-type transistor, and having a gate receiving said first signal.

5. The level conversion circuit according to claim 3, wherein said level shift circuit includes a second N-type transistor having a gate and a drain receiving said first signal, and a source connected to the backgate of said first N-type transistor.

6. The level conversion circuit according to claim 3, wherein said level shift circuit includes a predetermined number of diode elements, and a switching element connected in series with said predetermined number of diode elements between the line of said first potential and the backgate of said first N-type transistor, and rendered conductive in response to said first signal being set at said first potential.

7. The level conversion circuit according to claim 3, wherein said level shift circuit includes a plurality of diode elements, a switching element rendered conductive in response to said first signal being set at said first potential, and a switching circuit selecting diode elements of a number corresponding to a selection signal, of said plurality of diode elements, to connect the selected diode elements in series with said switching element, between the line of said first potential and the backgate of said first N-type transistor.

8. The level conversion circuit according to claim 7, wherein said level shift circuit further includes a potential detection circuit detecting said first potential and generating said selection signal based on a detected result, and the number of diode elements selected by said switching circuit increases as said first potential becomes higher.

9. The level conversion circuit according to claim 1, wherein said bias potential generation circuit includes a capacitor having one electrode connected to the line of said reference potential, a switching circuit providing conduction between the other electrode of said capacitor and the line of said first potential when said first signal is at said reference potential, and providing conduction between the other electrode of said capacitor and the backgate of said first N-type transistor when said first signal is at said first potential, and a diode element connected between the backgate of said first N-type transistor and the line of said reference potential.

10. The level conversion circuit according to claim 1, wherein said bias potential generation circuit applies said reference potential to the backgate of said first N-type transistor in response to at least one of said first and second signals being set at said reference potential.

11. The level conversion circuit according to claim 1, wherein said bias potential generation circuit applies said reference potential to the backgate of said first N-type transistor in response to said first signal being set at said reference potential.

12. The level conversion circuit according to claim 1, further comprising a comparison circuit comparing said first potential with a predetermined potential, to inactivate said bias potential generation circuit when said first potential is higher than said predetermined potential, to fix the backgate of said first N-type transistor at said reference potential.

13. The level conversion circuit according to claim 1, wherein said output node, said load circuit, said first N-type transistor and said bias potential generation circuit are provided in two sets, further comprising an inverter generating an inversion signal of said first signal, one of the load circuits being connected between the line of said second potential and one output node, and including a first P-type transistor having a gate connected to the other output node, the other one of the load circuits being connected between the line of said second potential and said other output node, and including a second P-type transistor having a gate connected to said one output node, one of the first N-type transistors having a drain connected to said one output node, a source connected to the line of said reference potential, and a gate receiving said first signal, the other one of the first N-type transistors having a drain connected to said other output node, a source connected to the line of said reference potential, and a gate receiving an inversion signal of said first signal, one of the bias potential generation circuits generating and applying said bias potential to the backgate of said one of the first N-type transistors, in response to said first signal being set at said first potential, the other one of the bias potential generation circuits generating and applying said bias potential to the backgate of said other one of the first N-type transistors, in response to the inversion signal of said first signal being set at said first potential.

14. The level conversion circuit according to claim 1, wherein said load circuit includes a resistance element connected between the line of said second potential and said output node.

15. A level conversion circuit converting a first signal having one level at a reference potential and the other level at a first potential higher than said reference potential into a second signal having one level at said reference potential and the other level at a second potential higher than said first potential, to output the converted signal to an output node, comprising:

a load circuit connected between a line of said second potential and said output node;

a first N-type transistor having a drain connected to said output node, a source connected to a line of said reference potential and a gate receiving said first signal; and a switching circuit receiving said reference potential and a bias potential that is higher than said reference potential and equal to or lower than a built-in potential of a PN junction between a backgate and the source of said first N-type transistor, applying said bias potential to the backgate of said first N-type transistor in response to said first signal being set at said first potential, and applying said reference potential to the backgate of said first N-type transistor in response to said first signal being set at said reference potential.

16. The level conversion circuit according to claim 15, wherein said switching circuit applies said bias potential to the backgate of said first N-type transistor in response to said first signal being set at said first potential and said second signal being set at said second potential, and applying said reference potential to the backgate of said first N-type transistor in response to at least one of said first signal and said second signal that is set at said reference potential.

17. The level conversion circuit according to claim 16, wherein said switching circuit includes first and second P-type transistors connected in parallel between a line of said first potential and a predetermined node, and having respective gates receiving said first signal and said second signal respectively, second and third N-type transistors connected in series between said predetermined node and a line of said reference potential, one of said second and third N-type transistors having its gate receiving said first signal and the other having its gate receiving said second signal, and an inverter applying said bias potential to the backgate of said first N-type transistor in response to said predetermined node being set at said reference potential, and applying said reference potential to the backgate of said first N-type transistor in response to said predetermined node being set at said first potential.

18. The level conversion circuit according to claim 16, further comprising a first inverter generating an inversion signal of said second signal, wherein said switching circuit includes a first P-type transistor connected between a line of said first potential and a predetermined node and having its gate receiving said first signal, a second N-type transistor connected in parallel with said first P-type transistor, having its gate receiving the inversion signal of said second signal generated by said first inverter, third and fourth N-type transistors connected in series between said predetermined node and the line of said reference potential, one of said third and fourth N-type transistors having its gate receiving said first signal, and the other having its gate receiving said second signal, and a second inverter applying said bias potential to the backgate of said first N-type transistor in response to said predetermined node being set at said reference potential, and applying said reference potential to the backgate of said first N-type transistor in response to said predetermined node being set at said first potential.

19. The level conversion circuit according to claim 15, further comprising a delay circuit delaying said first signal by a predetermined time, wherein said first N-type transistor has its gate receiving the first signal delayed by said delay circuit.

20. A level conversion circuit converting a first signal having one level at a reference potential and the other level at a first potential higher than said reference potential into a second signal having one level at said reference potential and the other level at a second potential higher than said first potential, to output the converted signal to an output node, comprising:

a load circuit connected between a line of said second potential and said output node; and an N-type transistor having a drain connected to said output node, a source connected to a line of said reference potential, a gate receiving said first signal, and a backgate receiving a bias potential equal to or lower than a built-in potential of a PN junction between the backgate and the source.

* * * * *